(12) United States Patent
Kumamoto

(10) Patent No.: US 6,962,862 B2
(45) Date of Patent: Nov. 8, 2005

(54) MANUFACTURING METHOD OF SEMICONDUCTOR DEVICE

(75) Inventor: Keita Kumamoto, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 3 days.

(21) Appl. No.: 10/197,670

(22) Filed: Jul. 18, 2002

(65) Prior Publication Data

US 2003/0022426 A1 Jan. 30, 2003

(30) Foreign Application Priority Data

Jul. 25, 2001 (JP) ......................................... 2001-224546

(51) Int. Cl.[7] .................. H01L 21/3205; H01L 21/336
(52) U.S. Cl. ........................ 438/595; 438/230; 438/303; 438/424
(58) Field of Search ............................... 438/218, 230, 438/303, 595, 424

(56) References Cited

U.S. PATENT DOCUMENTS

| | | | | |
|---|---|---|---|---|
| 4,855,247 A | * | 8/1989 | Ma et al. ..................... | 438/305 |
| 5,714,413 A | * | 2/1998 | Brigham et al. ............ | 438/301 |
| 5,783,475 A | * | 7/1998 | Ramaswami ................ | 438/303 |
| 5,851,890 A | * | 12/1998 | Tsai et al. .................... | 438/303 |
| 5,972,760 A | * | 10/1999 | Ju ............................... | 438/305 |
| 6,018,180 A | * | 1/2000 | Cheek et al. ................ | 257/344 |
| 6,074,922 A | * | 6/2000 | Wang et al. ................. | 438/303 |
| 6,127,711 A | * | 10/2000 | Ono ............................ | 257/410 |
| 6,133,105 A | * | 10/2000 | Chen et al. .................. | 438/296 |
| 6,140,192 A | * | 10/2000 | Huang et al. ................ | 438/305 |
| 6,153,483 A | * | 11/2000 | Yeh et al. .................... | 438/299 |
| 6,156,593 A | * | 12/2000 | Peng et al. .................. | 438/200 |
| 6,165,857 A | * | 12/2000 | Yeh et al. .................... | 438/303 |
| 6,200,840 B1 | * | 3/2001 | Chen et al. .................. | 438/184 |
| 6,235,606 B1 | * | 5/2001 | Huang et al. ................ | 438/400 |
| 6,255,152 B1 | * | 7/2001 | Chen ........................... | 438/199 |
| 6,291,351 B1 | * | 9/2001 | Li et al. ...................... | 438/692 |
| 6,291,354 B1 | * | 9/2001 | Hsiao et al. ................. | 438/701 |
| 6,297,112 B1 | * | 10/2001 | Lin et al. ..................... | 438/303 |
| 6,316,304 B1 | * | 11/2001 | Pradeep et al. ............. | 438/230 |
| 6,329,225 B1 | * | 12/2001 | Rodder ........................ | 438/299 |
| 6,391,732 B1 | * | 5/2002 | Gupta et al. ................. | 438/305 |
| 6,432,784 B1 | * | 8/2002 | Yu ............................... | 438/303 |
| 6,440,875 B1 | * | 8/2002 | Chan et al. .................. | 438/303 |

FOREIGN PATENT DOCUMENTS

| | | |
|---|---|---|
| JP | 6-97190 | 4/1994 |
| JP | 7-142726 | 6/1995 |
| KR | 2001-1765 | 1/2001 |
| KR | 2001-66327 | 7/2001 |

OTHER PUBLICATIONS

English Translation of KR2001001765 (Pub. Date: Jan. 5, 2001).*

* cited by examiner

Primary Examiner—Matthew Smith
Assistant Examiner—Lex H. Malsawma
(74) Attorney, Agent, or Firm—Young & Thompson

(57) ABSTRACT

A method of manufacturing a semiconductor device having an isolation region, a trench formed on a semiconductor substrate and an insulating film buried within the trench; includes: forming a gate electrode in an active region adjacent to the isolation region; applying an ion implantation onto the substrate to form a first dopant diffusion region; forming a first and a second insulating film, on the entire surface of the substrate; performing an etch back, to form a first sidewall of the second insulating film on a lateral face of the gate electrode; etching the first insulating film to form a second sidewall of the first insulating film on the lateral face of; making another ion implantation to form a second dopant diffusion region; forming an interlayer insulating film; and forming a contact hole to reach the second dopant diffusion region.

23 Claims, 13 Drawing Sheets

(a)

(b)

(c)

(a)

(b)

(c)

(a)

(b)

(a)

(b)

(c)

(a)

(b) Ion implantation (c)

(a)

(b)

(c)

(a)

(b)

(c)

(a)

(b)

(c)

(a)

(b)

MANUFACTURING METHOD OF SEMICONDUCTOR DEVICE

BACKGROUND OF THE INVENTION

1. Field of the Invention

The present invention relates to a method of manufacturing a semiconductor device having a trench isolation structure.

2. Description of the Prior Art

In recent years, accompanying the progress in technology to attain higher integration of the semiconductor device, there have been growing demands not only for the miniaturization of the device structure but also for the miniaturization of the isolation structure. For this purpose, in place of the conventional LOCOS (Local Oxidation of Silicon) method, the Trench Isolation method, suited well for the formation of minute structures of element isolation, has been proposed.

The formation of an isolation structure by the Trench Isolation method is carried out in the following way. First, by etching the semiconductor substrate deep enough to separate two neighbouring device elements, a sunken section or a trench is formed. Next, after an insulating film such as a silicon oxide film is formed so as to fill up this trench, the treatment for planarization is made by the chemical mechanical polishing (CMP) or such to remove the insulating film lying a region other than that within the trench, whereby an isolation region which is composed of the insulating film (the buried insulating film) buried in the trench is formed.

In a conventional method of manufacturing a semiconductor memory device such as a SRAM (Static Random Access Memory), a transistor is formed on a semiconductor substrate where such a trench isolation structure as described above is formed, in the following way.

FIG. 11 to FIG. 13 are a series of cross-sectional views illustrating the steps of a manufacturing method of a MOS (Metal Oxide Semiconductor) transistor having a LDD (Lightly Doped Drain) structure.

First, on a silicon substrate 101 where an isolation region 102 with a trench isolation structure is formed, a thermal oxidation film (not shown in the drawings) which is to serve as a gate insulator is formed, and thereafter a doped polycrystalline silicon film is formed. By patterning this polycrystalline silicon film by lithography and etching, a gate electrode 104 is then formed (FIG. 11(a)).

Next, using the gate electrode 104 as a mask, the ion implantation is performed to form LDD regions 105, where the concentration of implanted dopant is low, and the conductive type is opposite to the one of the substrate (FIG. 11(b)).

Following that, a silicon oxide film 106 is formed to cover the gate electrode 104 (FIG. 11(c)), and then by anisotropic etching of this film 106, sidewalls 106a are formed on lateral faces of the gate electrode 104 (FIG. 12(a)). This anisotropic etching (referred to as "sidewall etch back" hereinafter) is necessary to remove silicon oxide thoroughly on both the gate electrode 104 and the silicon substrate 101, so that the overetching is needed to be performed in the removal. However, this overetching also causes the etching of the buried insulating film of the silicon oxide film inside the trench isolation region 102, which leads to a lowering of the top surface of the buried insulating film with respect to the substrate surface plane.

Next, a channeling stop film 107 is formed on the surface, as shown in FIG. 12(b). The channeling stop film 107 is silicon oxide film, which is used to prevent channeling of a dopant in the subsequent step of an ion implantation to form source/drain regions 108. The source/drain regions 108 are formed by the ion implantation with a high dose through the channeling stop film 107. The sidewalls 106a are used as mask to form LDD regions 105a beneath the sidewalls 106a. In these way, a LDD structure is formed, wherein the region of the low dopant concentration of LDD region is located in neighbor with the region of the high dopant concentration of source/drain region.

Subsequently, an etching stopper film 109 of a silicon nitride film is formed, following an interlayer insulating film 110 of a silicon oxide film or such is formed (FIG. 12(c)).

A contact hole 111 is then formed on the source/drain region 108 by the lithography and etching (FIG. 13(a)). After that, using the sputtering method, a barrier metal film is formed inside the contact hole, and subsequently, using the CVD (Chemical Vapour Deposition) method, the contact hole is filled up with a metal film of W or such, whereby a contact is formed (not shown in the drawing).

Recently, in order to meet the requirements of the miniaturization and higher integration, the contact holes tend to be opened in the vicinity of trench isolation region. It can happen that the contact holes are formed overlapping to the isolation region, due to the alignment shift or the like. Beside, source/drain regions tend to have a shallower junction depth for the shrinkage of the transistor size. Thus, a problem of generating the leakage between the contact and the substrate may arise, as shown in FIG. 13(b).

This problem is caused by a lowering of the top surface of the buried insulating film in the trench isolation region 102, with respect to the substrate surface plane, as shown in FIG. 12(a), which originate from the overetching in the step of the sidewall etch back. In general, the overetching is carried out with additional 50% thickness of the whole thickness of the film subjected to etching. In other word, the thicker the film subjected to etching is, the longer etching period becomes. Since the silicon oxide film 106 for the formation of sidewalls has a considerable thickness of more than 100 nm or so, sidewall etch back must be performed for a long time. Therefore, the top surface of the buried insulating film in the isolation region becomes lowered to a deeper level. Moreover, if silicide films are formed on the source/drain regions, the top surface of the buried insulating film is lowered further to a still deeper level because of a treatment of removing the oxide film lying on the substrate.

When the contact holes 111 are formed overlapping to the isolation region 102 with the top surface level dropped, the bottom of the contact holes reaches to a still deeper level than the level of the junction depth of the source/drain regions 108 after the removal of the etching stopper film 109 on the top of the surface of the isolation region 102. At the section 112 which is dug into deeper than the junction depth of the source/drain region in the step of the removal of the etching stopper film 109, a leakage between the contact and the substrate occurs. This leakage becomes more likely to take place when the junction depth of the source/drain regions is set to be formed shallower.

Furthermore, crystal defects become more apt to be formed on the substrate surface by the overetching for the longer time period in the step of the sidewall etch back, which result in the deterioration of device characteristics such as the generation of a leakage.

SUMMARY OF THE INVENTION

In light of the above problems, an object of the present invention is to provide a method enabling to manufacture, with a high yield, a semiconductor device having excellent characteristics, wherein the foregoing leakage between the contact inside the isolation region and the substrate is prevented from occurring, or besides, by suppressing the plasma damage to the substrate surface in dry etching, generation of the foregoing leakage caused by defects is well prevented.

In accordance with the first aspect of the present invention, there is presented a method of manufacturing a semiconductor device which has an isolation region with a trench isolation structure, comprising a trench formed on a semiconductor substrate and a buried insulating film buried within said trench; which comprises the steps of:

forming a gate electrode in an active region adjacent to said isolation region on said semiconductor substrate;

applying an ion implantation onto said semiconductor substrate using said gate electrode as a mask to form a first dopant diffusion region which is to be used as a LDD region;

forming a first insulating film and a second insulating film, in this order, on the entire surface of a principal plane of said semiconductor substrate, inclusive of said gate electrode:

performing an etch back, using said first insulating film as an etching stopper, to form a first sidewall from said second insulating film on a lateral face of said gate electrode, with said first insulating film lying therebetween;

etching said first insulating film by an entire surface etch back to form a second sidewall from said first insulating film on the lateral face of said gate electrode;

making another ion implantation, using said gate electrode as well as said first and said second sidewall as a mask, to form a second dopant diffusion region which is to be used as a source/drain region;

forming an interlayer insulating film on the entire surface of the principal plane of said semiconductor substrate; and forming a contact hole opened on said second dopant diffusion region from the top surface of said interlayer insulating film.

In accordance with the second aspect of the present invention, there is presented a method of manufacturing a semiconductor device which has an isolation region with a trench isolation structure, comprising a trench formed on a semiconductor substrate and a buried insulating film buried within said trench; which comprises the steps of:

forming a gate electrode in an active region adjacent to said isolation region on said semiconductor substrate;

applying an ion implantation onto said semiconductor substrate using said gate electrode as a mask to form a first dopant diffusion region which is to be used as a LDD region;

forming a first insulating film and a second insulating film, in this order, on the entire surface of a principal plane of said semiconductor substrate, inclusive of said gate electrode;

performing an etch back, using said first insulating film as an etching stopper, to form a first sidewall from said second insulating film on a lateral face of said gate electrode, with said first insulating film lying therebetween;

etching said first insulating film by an entire surface etch back to form a second sidewall from said first insulating film on the lateral face of said gate electrode;

making another ion implantation, using said gate electrode as well as said first and said second sidewall as a mask, to form a second dopant diffusion region which is to be used as a source/drain region;

forming a third insulating film on the entire surface of the principal plane of said semiconductor substrate;

forming an interlayer insulating film on said third insulating film; and etching said interlayer insulating film selectively, with said third insulating film being used as an etching stopper, to expose said third insulating film, and, then, etching said third insulating film selectively, and thereby forming a contact hole to reach said second dopant diffusion region from the top surface of said interlayer insulating film.

In accordance with the third aspect of the present invention, there is presented a method of manufacturing a semiconductor device which has an isolation region with a trench isolation structure, comprising a trench formed on a semiconductor substrate and a buried insulating film buried within said trench; which comprises the steps of:

forming a gate electrode in an active region adjacent to said isolation region on said semiconductor substrate;

applying an ion implantation onto said semiconductor substrate using said gate electrode as a mask to form a first dopant diffusion region which is to be used as a LDD region;

forming a first insulating film and a second insulating film, in this order, on the entire surface of a principal plane of said semiconductor substrate, inclusive of said gate electrode;

performing an etch back, using said first insulating film as an etching stopper, to form a first sidewall from said second insulating film on a lateral face of said gate electrode, with said first insulating film lying therebetween;

forming a resist film being patterned so as to cover said isolation region;

etching said first insulating film by an entire surface etch back, with said resist film being used as a mask, whereby forming a second sidewall from said first insulating film on the lateral face of said gate electrode as well as a trench isolation cover from said first insulating film to cover said isolation region;

making another ion implantation, using said gate electrode as well as said first and said second sidewall as a mask, to form a second dopant diffusion region which is to be used as a source/drain region;

forming an interlayer insulating film on the entire surface of the principal plane of said semiconductor substrate; and etching said interlayer insulating film selectively under the condition that said trench isolation cover functions as an etching stopper, and thereby forming a contact hole to reach said second dopant diffusion region from the top surface of said interlayer insulating film.

In accordance with the fourth aspect of the present invention, there is presented a method of manufacturing a semiconductor device as described as the first, the second or the third aspect, wherein said second insulating film is formed of a material having a substantially identical etching rate with the one of said buried insulating film.

In accordance with the fifth aspect of the present invention, there is presented a method of manufacturing a semiconductor device as described as the second aspect, wherein said second insulating film and said buried insulating are each made of a silicon oxide film, while said first insulating film and said third insulating film are each made of a silicon nitride film.

In accordance with the sixth aspect of the present invention, there is presented a method of manufacturing a semiconductor device as described as the first or the thirds aspect, wherein said second insulating film and said buried insulating are each made of a silicon oxide film, while said first insulating film is made of a silicon nitride film.

In accordance with the seventh aspect of the present invention, there is presented a method of manufacturing a semiconductor device as described as any one of the first to the sixth aspects, which further comprises the step of forming an underlying insulating film on the entire surface of the principal plane of said semiconductor substrate, inclusive of said gate electrode,
   wherein said first insulating film is formed after said underlying insulating film is formed.

In accordance with the eighth aspect of the present invention, there is presented a method of manufacturing a semiconductor device as described as the seventh aspect, wherein, in performing the entire surface etch back to form said second sidewall, said underlying insulating film is etched together with said first insulating film, and the top surface of said gate electrode and the top surface of the substrate are exposed, whereby a third sidewall is formed from said underlying insulating film on the lateral face of said gate electrode.

In accordance with the ninth aspect of the present invention, there is presented a method of manufacturing a semiconductor device as described as the eighth aspect, wherein, in the formation of said second dopant diffusion region, after a channeling stop film is formed, at least, in said active region, a second dopant diffusion region is formed by applying the ion implantation through said channeling stop film thereto with said gate electrode as well as said first, said second and said third sidewall being used as a mask.

In accordance with the tenth aspect of the present invention, there is presented a method of manufacturing a semiconductor device as described as the seventh aspect, wherein, in performing the entire surface etch back to form said second sidewall, said first insulating film is etched in such a way that said underlying insulating film may remain; and
   a second dopant diffusion region which is to be used as a source/drain region is formed by applying the ion implantation thereto through said underlying insulating film.

In accordance with the eleventh aspect of the present invention, there is presented a method of manufacturing a semiconductor device as described as the tenth aspect, wherein a channeling stop film is formed on said underlying insulating film, and the second dopant diffusion region which is to be used as a source/drain region is formed by applying the ion implantation thereto through said underlying insulating film and said channeling stop film.

In accordance with the twelfth aspect of the present invention, there is presented a method of manufacturing a semiconductor device as described as any one of the seventh to the eleventh aspects, wherein the ion implantation to form said first dopant diffusion region is carried out after said underlying insulating film is formed but before said second insulating film is formed.

In accordance with the thirteenth aspect of the present invention, there is presented a method of manufacturing a semiconductor device as described as any one of the first to the twelfth aspects, wherein the ion implantation to form said first dopant diffusion region is carried out after said first insulating film is formed but before said second insulating film is formed.

In accordance with the fourteenth aspect of the present invention, there is presented a method of manufacturing a semiconductor device as described as any one of the first to the thirteenth aspects, wherein said contact hole is formed, extending partly into said second dopant diffusion region and said isolation region.

In accordance with the fifteenth aspect of the present invention, there is presented a method of manufacturing a semiconductor device which has an isolation region with a trench isolation structure, comprising a trench formed on a semiconductor substrate and a buried insulating film buried within said trench; which comprises the steps of:
   forming a gate electrode in an active region adjacent to said isolation region on said semiconductor substrate;
   applying an ion implantation onto said semiconductor substrate using said gate electrode as a mask to form a first dopant diffusion region which is to be used as a LDD region;
   forming a first insulating film on said semiconductor substrate;
   performing an entire surface etch back to form a sidewall from said first insulating film on a lateral face of said gate electrode;
   making another ion implantation, using said gate electrode and said sidewall as a mask, to form a second dopant diffusion region which is to be used as a source/drain region;
   forming a second insulating film on the entire surface of a principal plane of said semiconductor substrate;
   forming a resist film being patterned so as to cover said isolation region;
   etching said second insulating film, with said resist film being used as a mask, whereby forming a trench isolation cover from said second insulating film to cover said isolation region;
   forming an interlayer insulating film on the entire surface of the principal plane of said semiconductor substrate; and
   etching said interlayer insulating film selectively under the condition that said trench isolation cover functions as an etching stopper, and thereby forming a contact hole to reach said second dopant diffusion region from the top surface of said interlayer insulating film.

In accordance with the sixteenth aspect of the present invention, there is presented a method of manufacturing a semiconductor device which has an isolation region with a trench isolation structure, comprising a trench formed on a semiconductor substrate and a buried insulating film buried within said trench; which comprises the steps of:
   forming a gate electrode in an active region adjacent to said isolation region on said semiconductor substrate;
   applying an ion implantation onto said semiconductor substrate using said gate electrode as a mask to form a first dopant diffusion region which is to be used as a LDD region;
   forming a first insulating film on said semiconductor substrate;
   forming a resist film being patterned so as to cover said isolation region;
   etching back said first insulating film, with said resist film being used as a mask, whereby forming a trench isolation cover from said first insulating film to cover said isolation region, along with forming a sidewall on a lateral face of said gate electrode;

making another ion implantation, using said gate electrode and said sidewall as a mask, to form a second dopant diffusion region which is to be used as a source/drain region;

forming a second insulating film on the entire surface of a principal plane of said semiconductor substrate;

forming an interlayer insulating film on the entire surface of the principal plane of said semiconductor substrate; and etching said interlayer insulating film selectively, with said second insulating film being used as an etching stopper, to expose said second insulating film, and then etching said second insulating film and said channeling stop film selectively, and thereby forming a contact hole to reach said second dopant diffusion region from the top surface of said interlayer insulating film.

In accordance with the seventeenth aspect of the present invention, there is presented a method of manufacturing a semiconductor device as described as the fifteenth or the sixteenth aspect, wherein said first insulating film is formed of a material having a substantially identical etching rate with the one of said buried insulating film.

In accordance with the eighteenth aspect of the present invention, there is presented a method of manufacturing a semiconductor device as described as the fifteenth, the sixteenth or the seventeenth aspect, wherein said first insulating film and said buried insulating are each made of a silicon oxide film, while said second insulating film is made of a silicon nitride film.

In accordance with the nineteenth aspect of the present invention, there is presented a method of manufacturing a semiconductor device as described as any one of the fifteenth to the eighteenth aspects, which further comprises the step of forming a channeling stop film, at least, in said active region, wherein the ion implantation is applied thereto through said channeling stop film to form said second dopant diffusion region.

In accordance with the twentieth aspect of the present invention, there is presented a method of manufacturing a semiconductor device as described as any one of the fifteenth to the nineteenth aspects, wherein said contact hole is formed, extending partly into said second dopant diffusion region and said isolation region.

In accordance with the twenty-first aspect of the present invention, there is presented a method of manufacturing a semiconductor device which has an isolation region with a trench isolation structure, comprising a trench formed on a semiconductor substrate and a buried insulating film buried within said trench; which comprises the steps of:

forming an insulating film on the entire surface of a principal plane of said semiconductor substrate;

forming a resist film being patterned so as to cover said isolation region;

etching said insulating film, with said resist film being used as a mask, whereby forming a trench isolation cover from said insulating film to cover said isolation region;

forming an interlayer insulating film on the entire surface of the principal plane of said semiconductor substrate; and etching said interlayer insulating film selectively under the condition that said trench isolation cover functions as an etching stopper, and thereby forming a contact hole to reach a dopant diffusion region from the top surface of said interlayer insulating film.

In accordance with the twenty-second aspect of the present invention, there is presented a method of manufacturing a semiconductor device as described as the twenty-first aspect, wherein said buried insulating film is made of a silicon oxide film, while said insulating film is made of a silicon nitride film.

In accordance with the twenty-third aspect of the present invention, there is presented a method of manufacturing a semiconductor device as described as any one of the first to the twenty-second aspects, wherein said interlayer insulating film is formed of a material having a substantially identical etching rate with the one of said buried insulating film.

In the present invention, a drop of the top surface level of the buried insulating film inside the trench can be prevented or suppressed when a contact hole is formed overlapping the trench isolation, and the leakage between the contact and the substrate can be prevented well. Consequently, a semiconductor device may be manufactured with improved characteristics and high yield.

In the first to the third aspect of the present invention, it serves effectively for the suppression of the drop of the top surface level of the buried insulating film inside the trench that a stopper film of the etching to form the first sidewall is formed over the entire surface of the substrate including the isolation region. Since the stopper film prevents from overetching of the buried insulating film inside the isolation region in the step of the formation of the first sidewall, the top surface level of the trench isolation region is kept high. For this reason, the bottom of the contact hole hardly reach to the deeper level inside the trench isolation when a contact hole is formed overlapping the trench isolation region. Moreover, the stopper film prevents from the exposure of the substrate surface to the plasma atmosphere in the step of forming the first sidewall, and the generation of the plasma damage to the substrate surface is suppressed. Thus, the leakage caused by defects is also suppressed.

In the third, the fifteenth and the twenty-first aspects of the present invention, it serves effectively for the prevention of a contact hole to reach to the deeper level inside the trench isolation that a cover film is formed over the isolation region in the prior step of forming an inter layer insulating film. When a contact hole is formed overlapping the trench isolation region, the cover film over the trench isolation region protects the isolation region, functioning as an etching stopper film, and, thus, a drop of the buried insulating film inside the trench isolation can be prevented.

In the sixteenth aspect of the present invention, it serves effectively for the prevention of a contact hole to reach to the deeper level inside the trench isolation that a cover film is formed over the isolation region in the prior step of the etch back to form the sidewall. Since the buried insulating film inside the trench isolation region is not etched and the top surface level of the trench isolation region is made high, the bottom of the contact hole hardly reach to the deeper level inside the trench isolation when a contact hole is formed overlapping the trench isolation region. Furthermore, because the cover film over the trench isolation can be formed in the same step as the formation of the sidewall, the cover film formation is simply and conveniently performed without requiring additional steps of growing another film, leading to the reduction of the process cost.

DETAILED DESCRIPTION OF THE INVENTION

Figure 1:
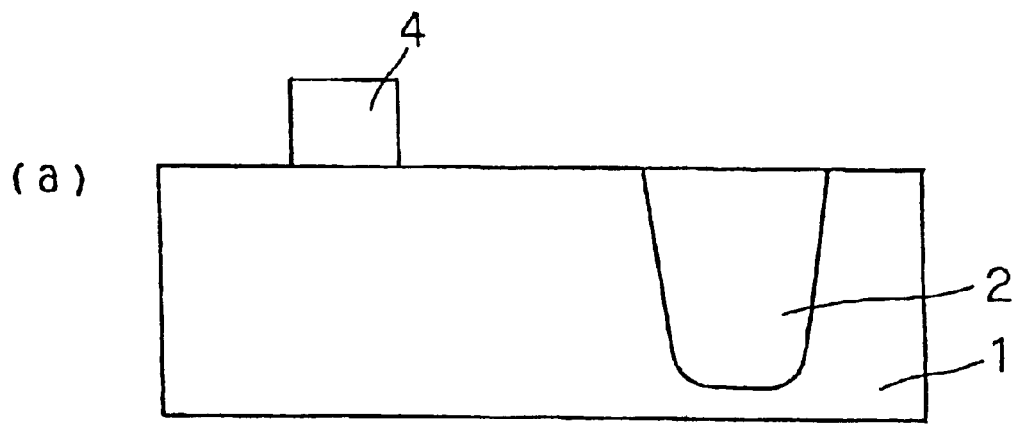
FIG. 1 is a series of schematic cross-sectional views illustrating the steps of the first embodiment of a manufacturing method of a semiconductor device according to the present invention.
Figure 1:
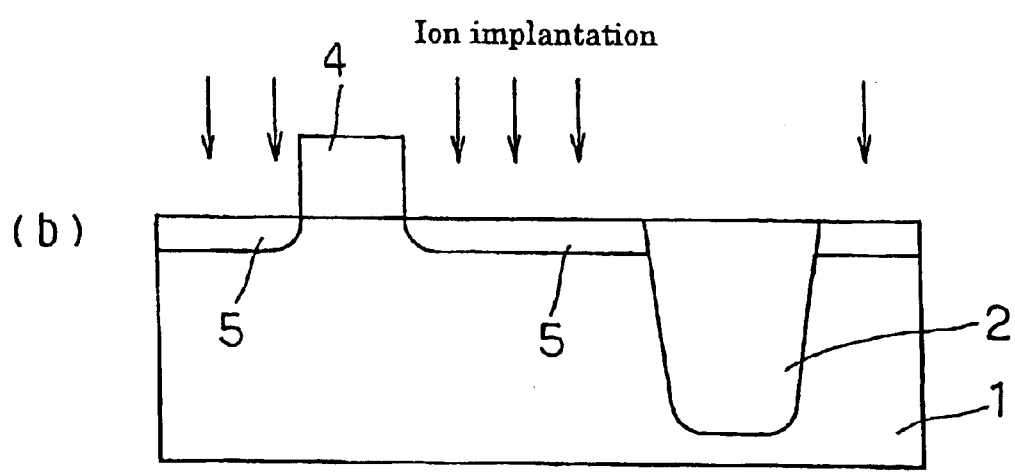
Figure 1:
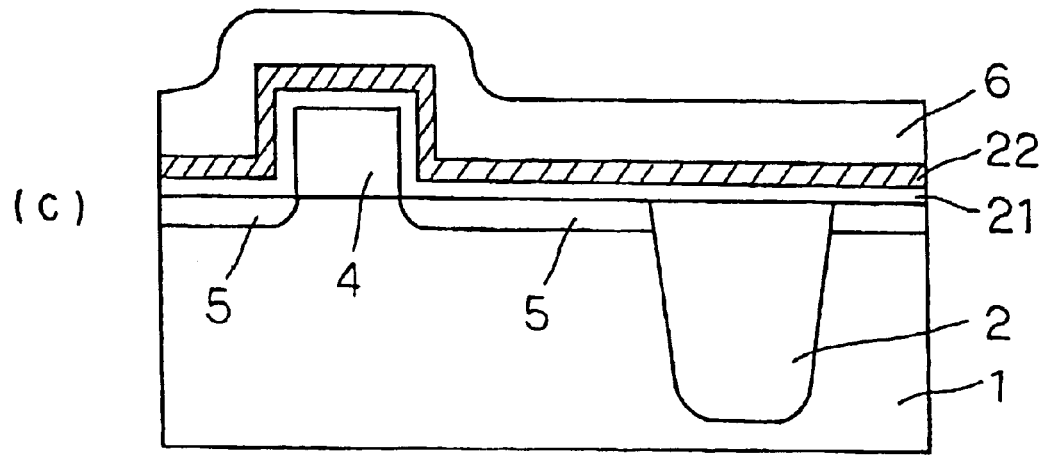
Figure 2:
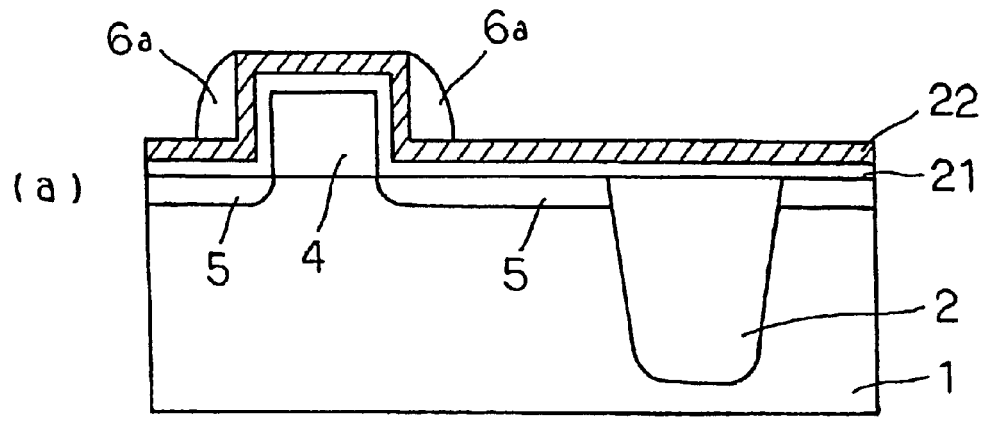
FIG. 2 is a series of schematic cross-sectional views illustrating further steps of the first embodiment of a manufacturing method of a semiconductor device according to the present invention.
Figure 2:
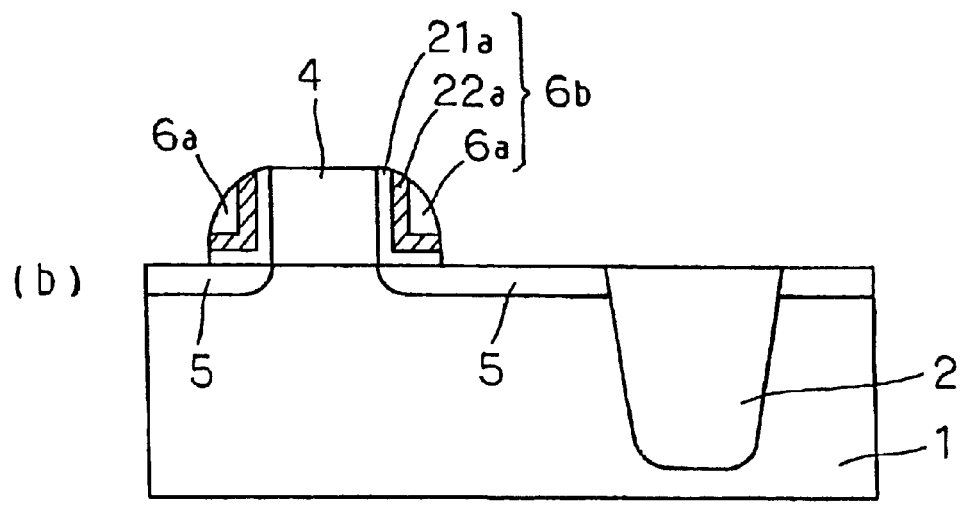
Figure 2:
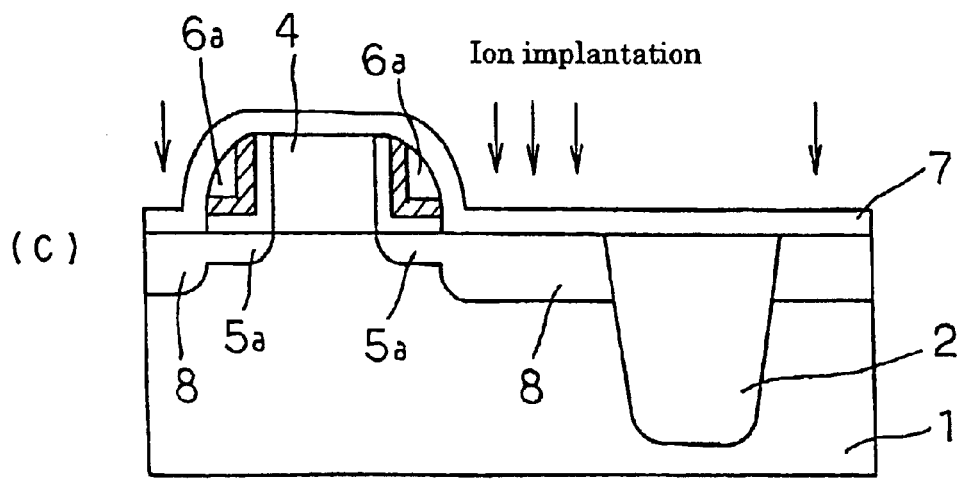
Figure 3:
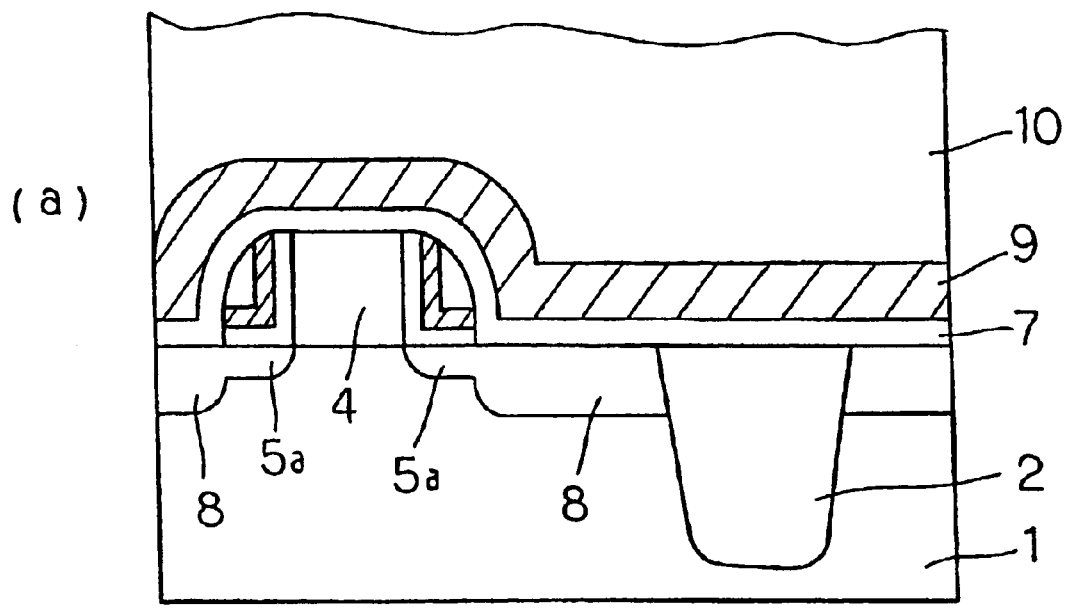
FIG. 3 is a series of schematic cross-sectional views illustrating further steps of the first embodiment of a manufacturing method of a semiconductor device according to the present invention.
Figure 3:
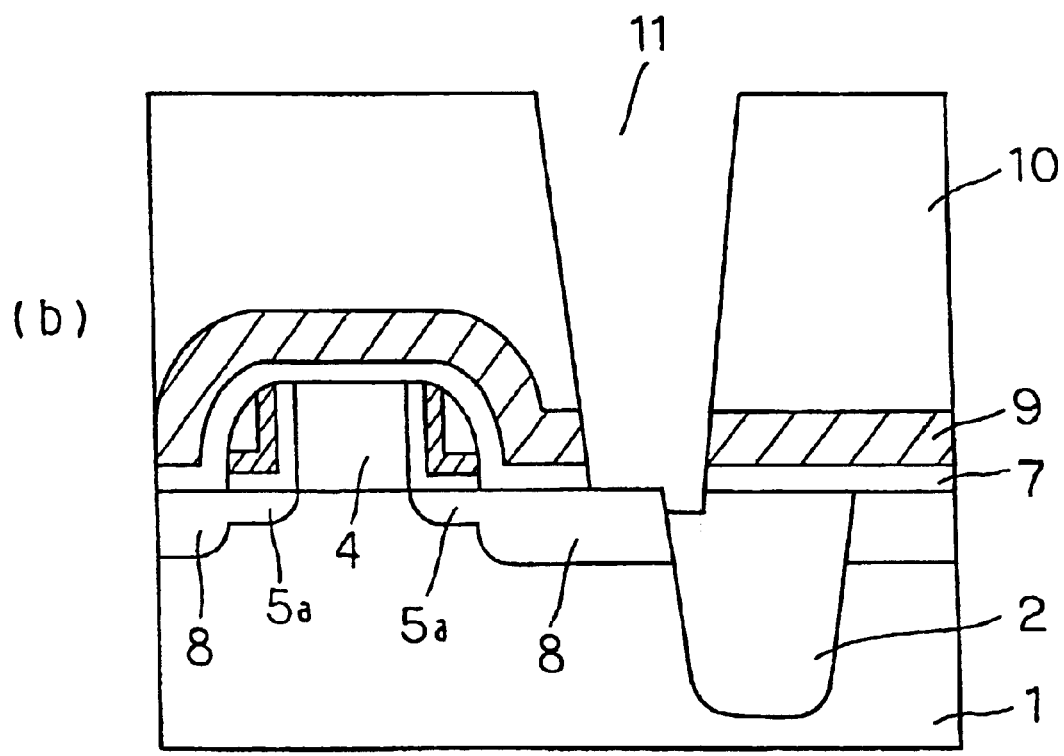

The preferred embodiments of the present invention are described below.
First Embodiment
Referring to the drawings, the first embodiment of the present invention is described in detail. FIG. 1 to FIG. 3 are a series of schematic cross-sectional views illustrating the steps of a manufacturing method of a MOS transistor having a LDD structure.

First, in a prescribed region of a semiconductor substrate 1, a trench isolation region is formed by a known method, in which a silicon oxide film is buried.

On the silicon substrate 1, a gate insulator of a thermal oxidation film (not shown in the drawings) with a thickness from 2 nm to 15 nm is formed, and a doped polycrystalline silicon film with a thickness from 100 nm to 200 nm is subsequently formed on the gate insulator. By patterning this polycrystalline silicon film by lithography and etching, a gate electrode 4 is then formed (FIG. 1(a)). Hereat, a silicide film and a cap insulating film can be formed on the gate electrode by sputtering a silicide film such as a W silicide film on the doped polycrystalline silicon film and depositing an insulating film such as a silicon oxide film on the silicide film, and thereafter carrying out patterning.

Next, using the gate electrode 4 as a mask, an ion implantation for the formation of LDD region 5 is performed under the condition of a conductive type opposite to the one of the substrate, an accelerating energy from 5 keV to 50 keV, and a dose from $1\times10^{12}/cm^2$ to $5\times10^{14}/cm^2$ or so (FIG. 1(b)). The p-type LDD region is formed by using the dopant of boron (B) or $BF_2$, while the n-type LDD region is formed by using the dopant of phosphorus (P) or arsenic (As). It is noted that an ion implantation for the formation of LDD regions 5 is possible after the deposition of a silicon oxide film 21 on the substrate surface in the subsequent step. It is also possible to perform the ion implantation for the formation of the LDD regions 5, even after a silicon oxide film 21 and a silicon nitride film 22 is formed.

Next, a silicon oxide film 21 with a thickness from 5 nm to 10 nm is formed over the entire surface of the substrate including the gate electrode 4 by the CVD method, and a silicon nitride film 22 with a thickness from 5 nm to 10 nm is deposited thereon. Then, a silicon oxide film 6 with a thickness from 50 nm to 200 nm is formed over the entire surface of the substrate by the CVD method (FIG. 1(c)). For instance, the thicknesses of the silicon oxide film 21, the silicon nitride film 22, and the silicon oxide film 6 can be set to be 10 nm, 10 nm, and 100 nm, respectively.

Next, using the silicon nitride film 22 as an etching stopper, an anisotropic etching is applied to above mentioned silicon oxide film 6, and sidewalls 6a are formed on the lateral faces of the gate electrode, with both the silicon oxide film 21a and the silicon nitride film 22a lying therebetween (FIG. 2(a)). Subsequently, using the sidewalls 6a as a mask, wet etching or dry etching is carried out to remove the silicon nitride film 22 and the silicon oxide film 21 to expose the top surface of both the gate electrode 4 and the silicon substrate. As a result, on the lateral faces of the gate electrode 4, there are formed sidewalls 6b made of a layered film in which layers of the silicon oxide film 21a, the silicon nitride film 22a and the silicon oxide film 6a are laid in this order (FIG. 2(b)). Because the etching of the thick silicon oxide film 6 is stopped once on the silicon nitride film 22 and the amount of overetching thickness of the thin films of the silicon nitride film 22 and the silicon oxide film 21 is so small that a drop of the top surface level of the buried oxide film inside trench of the isolation region 2 can be greatly suppressed. It is compared with the conventional sidewalls composed only of thick silicon oxide film which is overetched in larger amount of thickness. Furthermore, it is indicated that smaller amount of overetching thickness reduce the plasma damage to the substrate surface, because the exposure of the substrate surface to the plasma atmosphere in the dry etching step of forming the sidewalls becomes much shortened.

It is noted that the silicon oxide film 21 serves to prevent the generation of an interface energy level that may arise if a silicon nitride film 22 is formed directly over the substrate. However, it is possible to remove the silicon oxide film 21 in the case that a gate insulator of a silicon oxide film remains on the entire substrate surface after the gate etching, or in the case that the silicon nitride film 22 is replaced to an insulating film which does not generate an energy level of the interface with the substrate and can serve as an etching stopper in the step of etching back the silicon oxide film 6.

Further, it is possible to leave the silicon oxide film 21 on the entire substrate surface after the removal of the silicon nitride film 22 in the formation of layered sidewalls. In this case, the film 21 can be used as a channeling stop film in the subsequent step of ion implantation to form the source/drain regions. It is also possible that additional insulating film such as a silicon oxide film can be formed on the silicon oxide film 21 after the silicon nitride film 22 is removed to serve as a channeling stop film in the ion implantation. By leaving the silicon oxide film 21 on the entire substrate surface, the substrate surface becomes unexposed to the plasma atmosphere in dry etching so that the generation of crystal defect on the substrate surface is small.

Next, in order to prevent channeling in the subsequent step of an ion implantation for the formation of source/drain regions, a channeling stop film 7 of a silicon oxide film or such is formed with a thickness from 5 nm to 30 nm. However, if another preventive measure against channeling can be taken, the channeling stop film 7 may be removed. Subsequently, through the channeling stop film 7, an ion implantation for the formation of source/drain region 8 is carried out under the condition of a conductive type opposite to the one of the substrate, an accelerating energy from 5 kev to 60 keV, and a dose from $5 \times 10^{14}/cm^2$ to $7 \times 10^{15}/cm^2$ or so (FIG. 2(c)). The p-type source/drain region is formed by using the dopants of boron (B) or $BF_2$, while the n-type source/drain region is formed by using the dopants of phosphorus (P) or arsenic (As). The sidewalls 6a are used as mask to form LDD regions 5a beneath the sidewalls 6a. In these way, a LDD structure is formed, wherein the region of the low dopant concentration of LDD region is located in neighbor with the region of the high dopant concentration of source/drain region. After the ion implantation for the formation of source/drain region 8, the dopants are activated by a heat treatment conducted at 800° C. to 1000° C. or so. The junction depth of the source/drain regions becomes about 0.1 μm to 0.2 μm or so.

Silicide films is possible to formed on both the source/drain regions 8 and the gate electrode 4. An example of forming silicide films is as follows.

First, wet etching is performed to remove the channeling stop film 7 and to expose the top surfaces of both the substrate and the gate electrode. The upper part of the buried insulating layer inside the trench isolation region 2 is also subjected to the etching. However, the drop of the trench isolation surface is small because overetching for the removal of the thin channeling stop film 7 is employed in small amount of thickness.

Second, a metal film of Co or such is formed on the entire surface of the substrate by the sputtering method. A heat treatment at 600° C. to 800° C. or so is then applied thereto to react the metal film with the polycrystalline silicon in the gate electrode as well as silicon in the source/drain regions and transform to the silicide films only on the silicon surface. Metal on the surface of the insulator like the trench isolation region and the sidewalls are left unreacted, which is removed by wet etching. As a result, silicide films are formed in self-align, both on the gate electrode and the source/drain regions. In the case that a cap insulating layer is set on the gate electrode, no silicide film is formed on the gate electrode.

Next, an etching stopper film 9 of a silicon nitride film is formed with a thickness from 10 nm to 100 nm or so over the entire surface of the substrate, and an interlayer insulating film 10 of a silicon oxide film or such is then formed with a thickness from 300 nm to 1000 nm or so (FIG. 3(a)).

Next, a contact hole 11 is opened on the source/drain regions 8 by lithography and anisotropic etching (FIG. 3(b)). Thereat, the etching is once stopped at the stopper film 9, and then resumed to remove both the stopper film 9 and the channeling stop film 7. After that, using the CVD method or the sputtering method, a barrier metal film is formed inside the contact hole 11, and then, using the CVD method, the contact hole is filled up with a metal film of W or such, whereby a contact is formed (not shown in the drawing).

In the method described above, the top surface level of the buried oxide film inside the trench isolation region 2 is kept high in the step of forming the sidewalls (FIGS. 2(a) and (b)). Therefore, the bottom of the contact hole is prevented to reach lower than the junction depth of the source/drain region when a contact hole is formed overlapping the trench isolation region 2, and thus the leakage between the contact and the substrate can be prevented.

Second Embodiment

Figure 4:
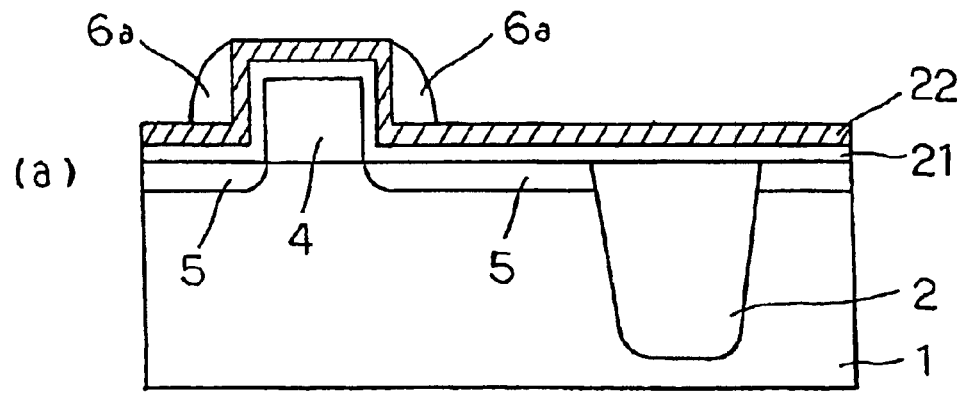
FIG. 4 is a series of schematic cross-sectional views illustrating the steps of the second embodiment of a manufacturing method of a semiconductor device according to the present invention.
Figure 4:
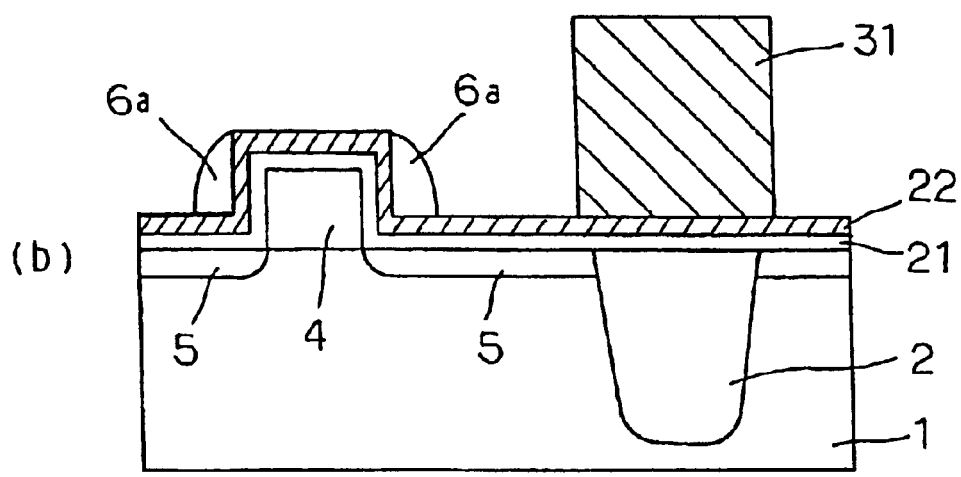
Figure 4:
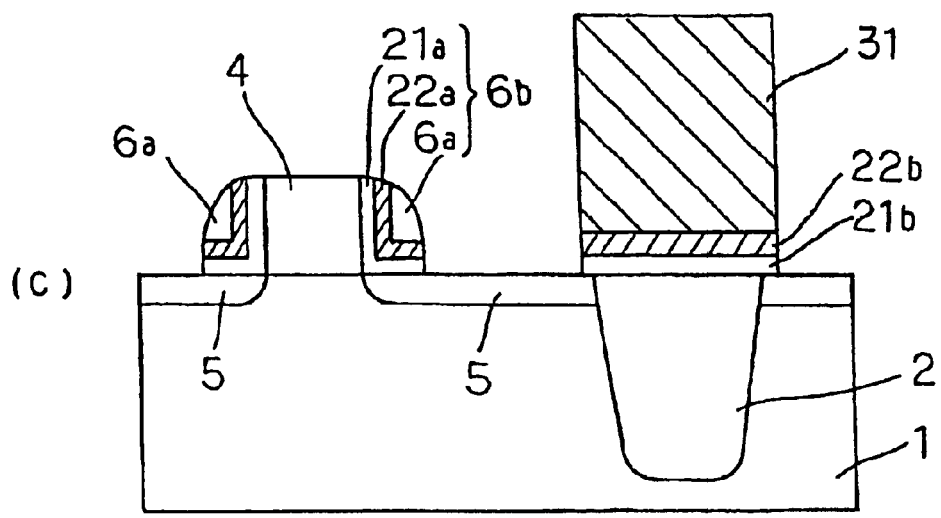
Figure 5:
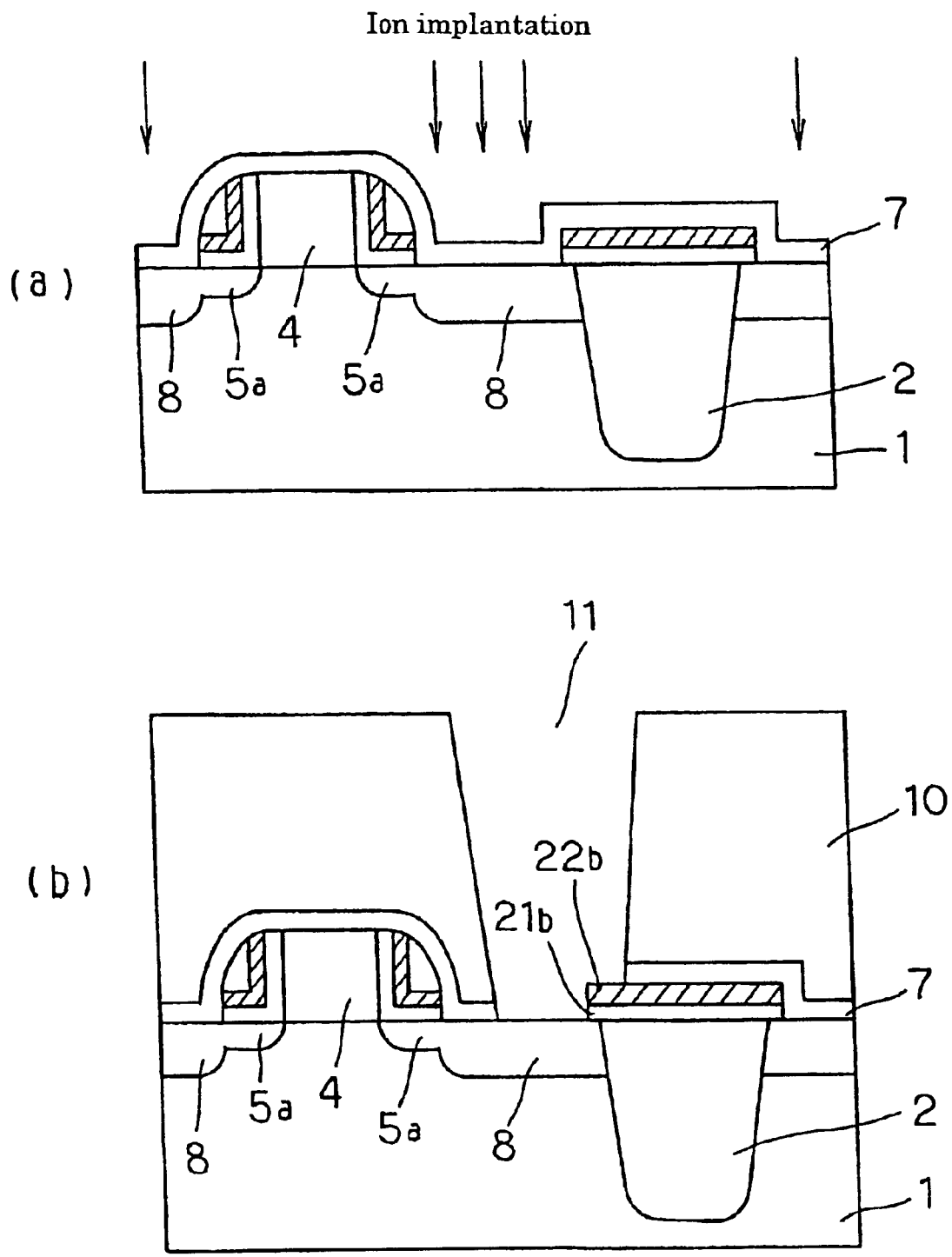
FIG. 5 is a series of schematic cross-sectional views illustrating further steps of the second embodiment of a manufacturing method of a semiconductor device according to the present invention.

FIG. 4 to FIG. 5 are a series of schematic cross-sectional views illustrating the steps of the second embodiment of a manufacturing method according to the present invention. Hereat, FIG. 4(a) and FIG. 2(a) show the same drawing. A structure shown in FIG. 4(a) is formed in like manner as the steps shown from FIG. 1(a) to FIG. 2(a).

FIG. 4(b) shows that a resist film 31 is formed on the silicon nitride film 22 to cover the region above the trench isolation region 2. The pattern of a resist film 31 is same as the pattern of trench isolation region. Thus, in the patterning of the resist film 31, the same mask can be used as in the trench isolation region patterning.

Subsequently, the formation of sidewalls is performed by anisotropic etching to remove the silicon nitride film 22 and the silicon oxide film 21 and to expose the top surface of both the gate electrode 4 and the silicon substrate. As a result, the layered film of sidewalls 6b composed of the silicon oxide film 21a, the silicon nitride film 22a and the silicon oxide film 6a are formed on the lateral faces of the gate electrode 4. The plasma damage to the substrate surface is much reduced as the same reason as described in First Embodiment, i.e., etching of the thick silicon oxide film 6 is stopped once on the silicon nitride film 22 and the amount of overetching thickness of the thin films of the silicon nitride film 22 and the silicon oxide film 21 is small. It is noted that the silicon oxide film 21b and the silicon nitride film 22b are left under the resist film 31, preventing from the etching of silicon oxide film inside the trench isolation region 2 in the step of the sidewall formation.

Next, after removing the resist film 31, a silicon oxide film 7 with a thickness from 5 nm to 30 nm or so is formed to serve as a channeling stop film in the subsequent step of an ion implantation for the formation of the source/drain regions. However, if another preventive measure against channeling can be taken, the silicon oxide film 7 may be removed. Subsequently, in the same way as the first embodiment, an ion implantation is applied through the silicon oxide film 7 to form source/drain regions 8 with high concentration of dopant, and thereafter a heat treatment is performed to activate source/drain regions (FIG. 5(a)).

Further, metal silicide films is possible to be formed on the top surfaces of both the source/drain regions and the gate electrode in the same way as the first embodiment.

Next, after an interlayer insulating film 10 of a silicon oxide film or such is formed with a thickness from 300 nm to 1000 nm or so, a contact hole 11 is opened on the source/drain region 8 by lithography and anisotropic etching (FIG. 5(b)). Hereat, the contact etching is stopped on silicon nitride film 22b which cover the trench isolation region when a contact hole is formed overlapping the trench isolation region 2. Thus, the bottom of the contact hole is prevented to reach lower than the junction depth of the source/drain region inside the trench isolation region. Moreover, it is possible to form an interlayer insulating film 10 without another etching stopper film like the silicon nitride film 9 as described in First Embodiment, which leads to the reduction of the number of the steps of film growth and facilitates the curtailment of the production cost.

After that, using the CVD method or the sputtering method, a barrier metal film is formed inside the contact hole 11, and the contact hole is filled up with a metal film of W or such using the CVD method, whereby a contact is formed (not shown in the drawing).

In the second embodiment, the silicon oxide film inside the trench isolation region is hardly etched in the step of the sidewall formation, and the top surface level of the buried oxide film inside the trench isolation region 2 does not fall at all. Therefore, the leakage between the contact and the substrate in the device that has a shallower junction depth of the source/drain region is more improved than the case in the first embodiment, where the top surface level of the buried oxide film inside the trench isolation region 2 can be a little lowered by the dry etching process of the sidewall formation. In other word, the second embodiment suits for the device which is further miniaturized.

Third Embodiment

Figure 6:
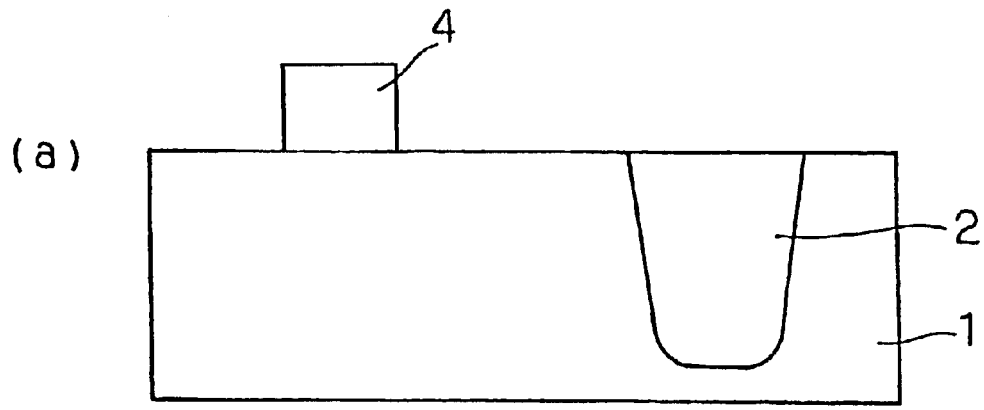
FIG. 6 is a series of schematic cross-sectional views illustrating the steps of the third embodiment of a manufacturing method of a semiconductor device according to the present invention.
Figure 6:
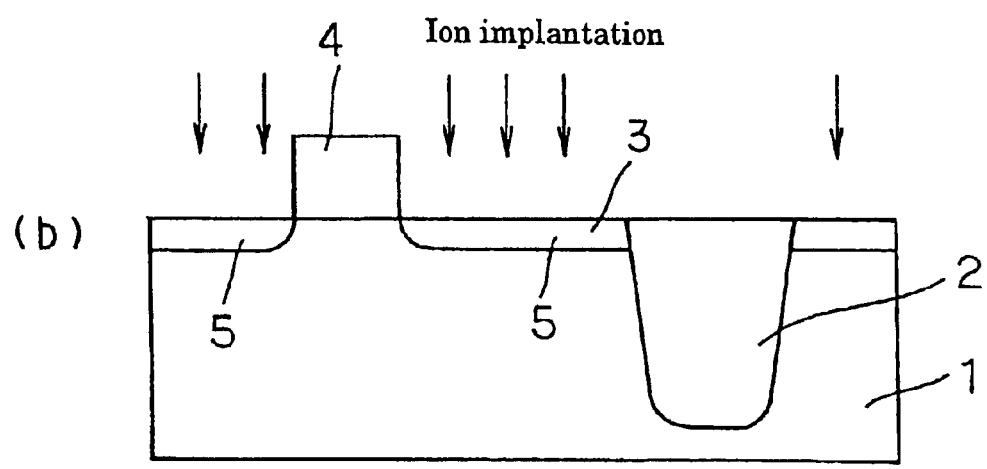
Figure 6:
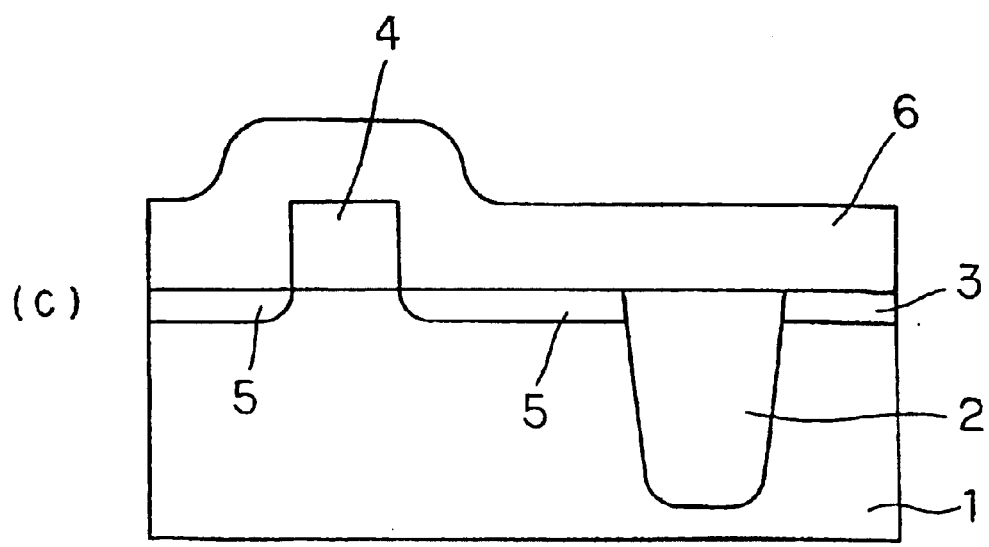
Figure 7:
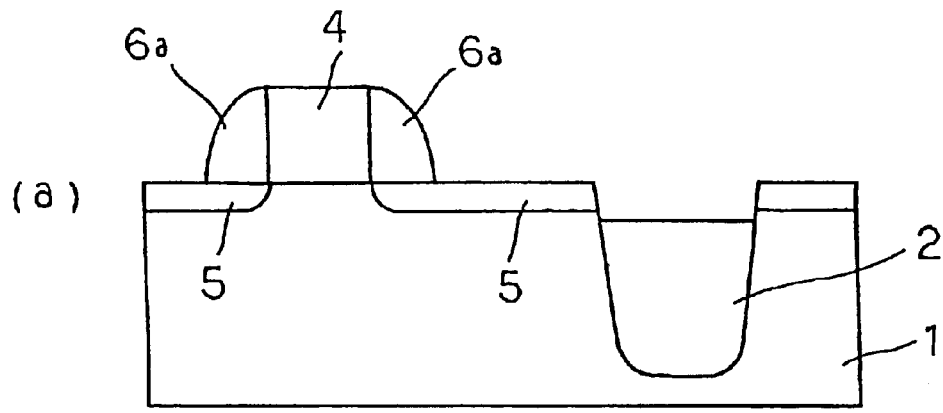
FIG. 7 is a series of schematic cross-sectional views illustrating further steps of the third embodiment of a manufacturing method of a semiconductor device according to the present invention.
Figure 7:
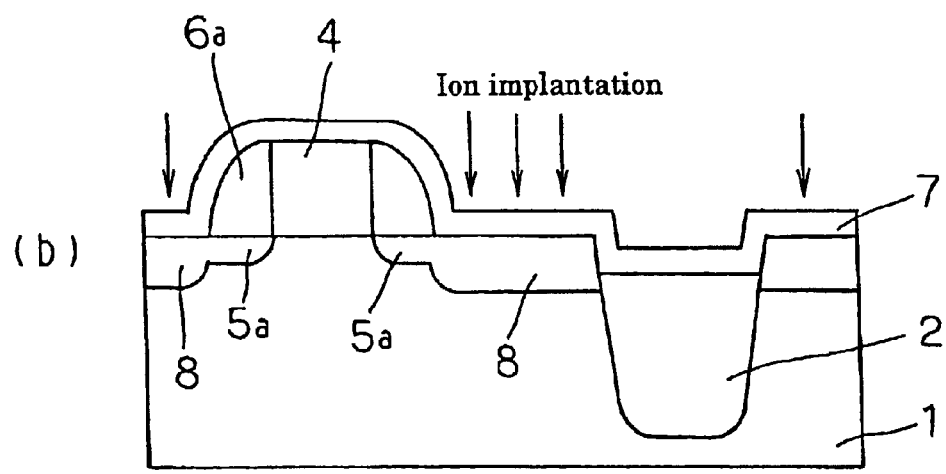
Figure 7:
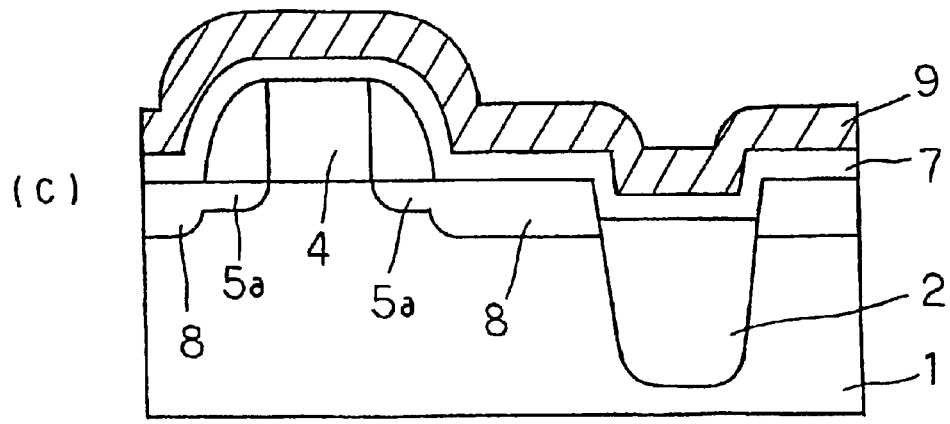
Figure 8:
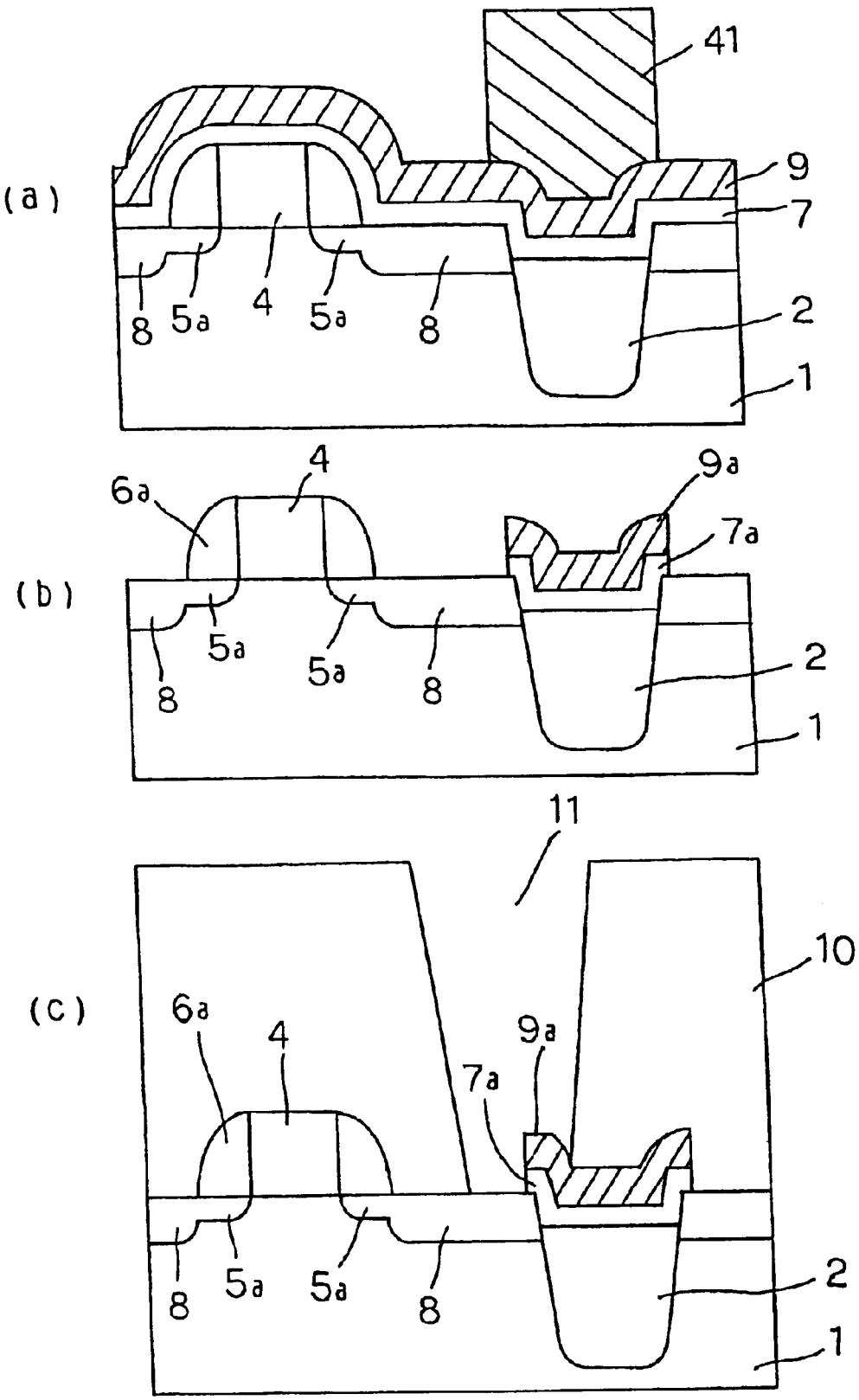
FIG. 8 is a series of schematic cross-sectional views illustrating further steps of the third embodiment of a manufacturing method of a semiconductor device according to the present invention.

FIG. 6 to FIG. 8 are a series of schematic cross-sectional views illustrating the steps of the third embodiment of a manufacturing method according to the present invention.

As shown in FIG. 6(a), following that a trench isolation region buried with silicon oxide film is formed on the silicon substrate 1 by a known method, a gate insulator of a thermal oxidation film (not shown) and a doped polycrystalline silicon layer are formed and the gate electrode 4 is formed by patterning the polycrystalline silicon film.

Next, in the same way as the first embodiment, using the gate electrode 4 as a mask, an ion implantation is performed to form LDD regions 5 with low concentration of dopant and a conductive type with opposite to the one of the substrate (FIG. 6(b)).

Next, over the entire surface of the substrate, a silicon oxide film 6 with a thickness from 50 nm to 200 nm is formed, by the CVD method, to cover the gate electrode 4 (FIG. 6(c)), and then, by etching back this silicon oxide film 6, sidewalls 6a are formed on lateral faces of the gate electrode 4 (FIG. 7(a)). This etch back is carried out by applying anisotropic etching onto the silicon oxide film 6 so as to expose the top surfaces of both the gate electrode 4 and the silicon substrate 1.

Next, a channeling stop film 7 of silicon oxide film or such is formed with a thickness from 5 nm to 30 nm to prevent channeling in the subsequent step of the ion implantation for the formation of the source/drain region. However, it is possible to remove this channeling stop film 7, if another preventive measure against channeling can be taken. Subsequently, in the same way as the first embodiment, an ion implantation is applied through this channeling stop film 7 and thereby the source/drain regions 8 with high concentration of dopant are formed, and thereafter a heat treatment is performed to activate the source/drain regions (FIG. 7(b)). It is possible to form silicide films both on the source/drain regions and the gate electrode in the same way as the first embodiment.

Next, an etching stopper film 9 of a silicon nitride film is formed with a thickness from 10 nm to 100 nm on the entire surface of the substrate (FIG. 7(c)).

After that, a resist film 41 is formed on the silicon nitride film 9 to cover the region above the trench isolation region 2. The pattern of a resist film 41 is same as the pattern of trench isolation region. Thus, in the patterning of the resist film 41, the same mask can be used as in the trench isolation region patterning (FIG. 8(a)).

Following that, dry etching is carried out with the resist film 41 to remove the silicon nitride film 9 and the silicon oxide film 7 and to expose the top surface of both the gate electrode 4 and the silicon substrate and, then, the resist film 41 is removed. As a result, there exist the silicon oxide film 7a and the silicon nitride film 9a only on the surface of the trench isolation region (FIG. 8(b)). Further it is possible to leave the silicon oxide film 7, removing only the silicon nitride film 9 by stopping the dry etching at the silicon oxide film 7. In this case, the substrate surface cannot be exposed to the plasma atmosphere in the dry etching so that the plasma damage to the substrate surface can be well reduced.

Next, following an interlayer insulating film 10 of a silicon oxide film or such is formed with a thickness from 300 nm to 1000 nm or so, a contact hole 11 is opened on the source/drain region 8 by lithography and anisotropic etching (FIG. 8(c)). It is noted that the etching for contact hole is stopped on silicon nitride film 9a which cover the trench isolation region when a contact hole is formed overlapping the trench isolation region 2. Thus, the bottom of the contact hole is prevented to reach lower than the junction depth of the source/drain region inside the trench isolation region, and the leakage between the contact and the substrate is prevented.

After that, using the CVD method or the sputtering method, a barrier metal film is formed inside the contact hole 11, and then, using the CVD method, the contact hole is filled with a metal film of W or such, whereby a contact is formed (not shown in the drawing).

Fourth Embodiment

Figure 9:
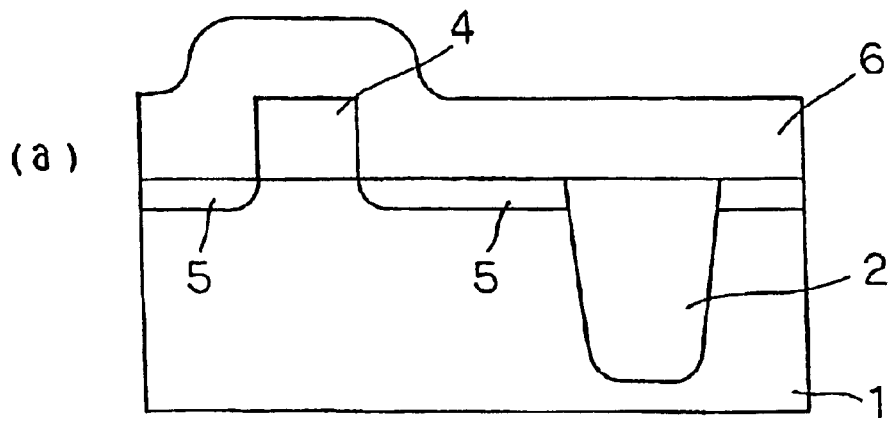
FIG. 9 is a series of schematic cross-sectional views illustrating the steps of the fourth embodiment of a manufacturing method of a semiconductor device according to the present invention.
Figure 9:
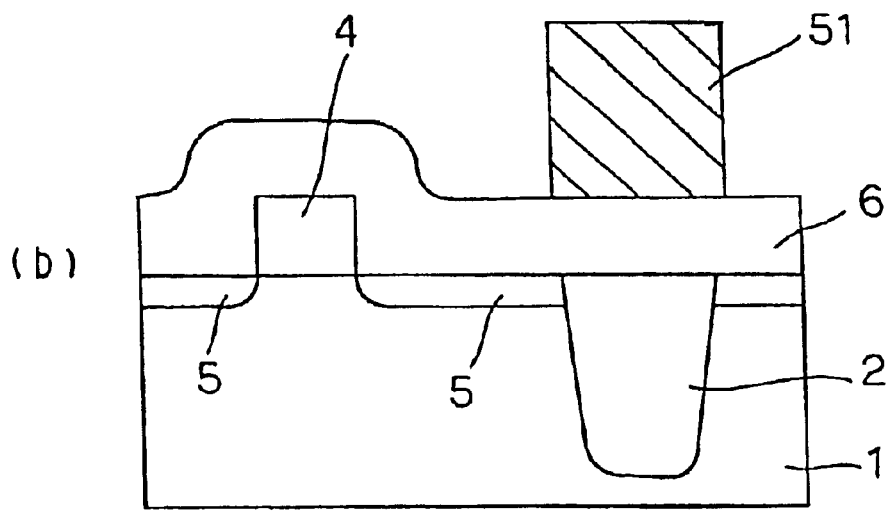
Figure 9:
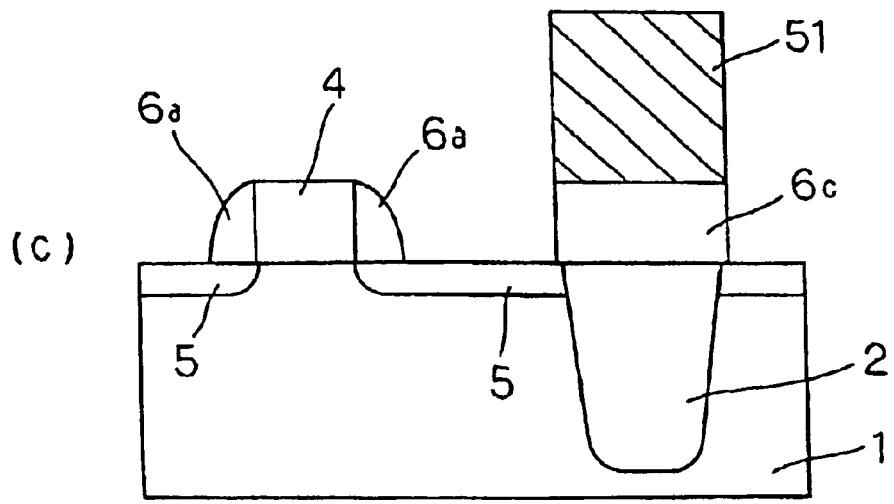
Figure 10:
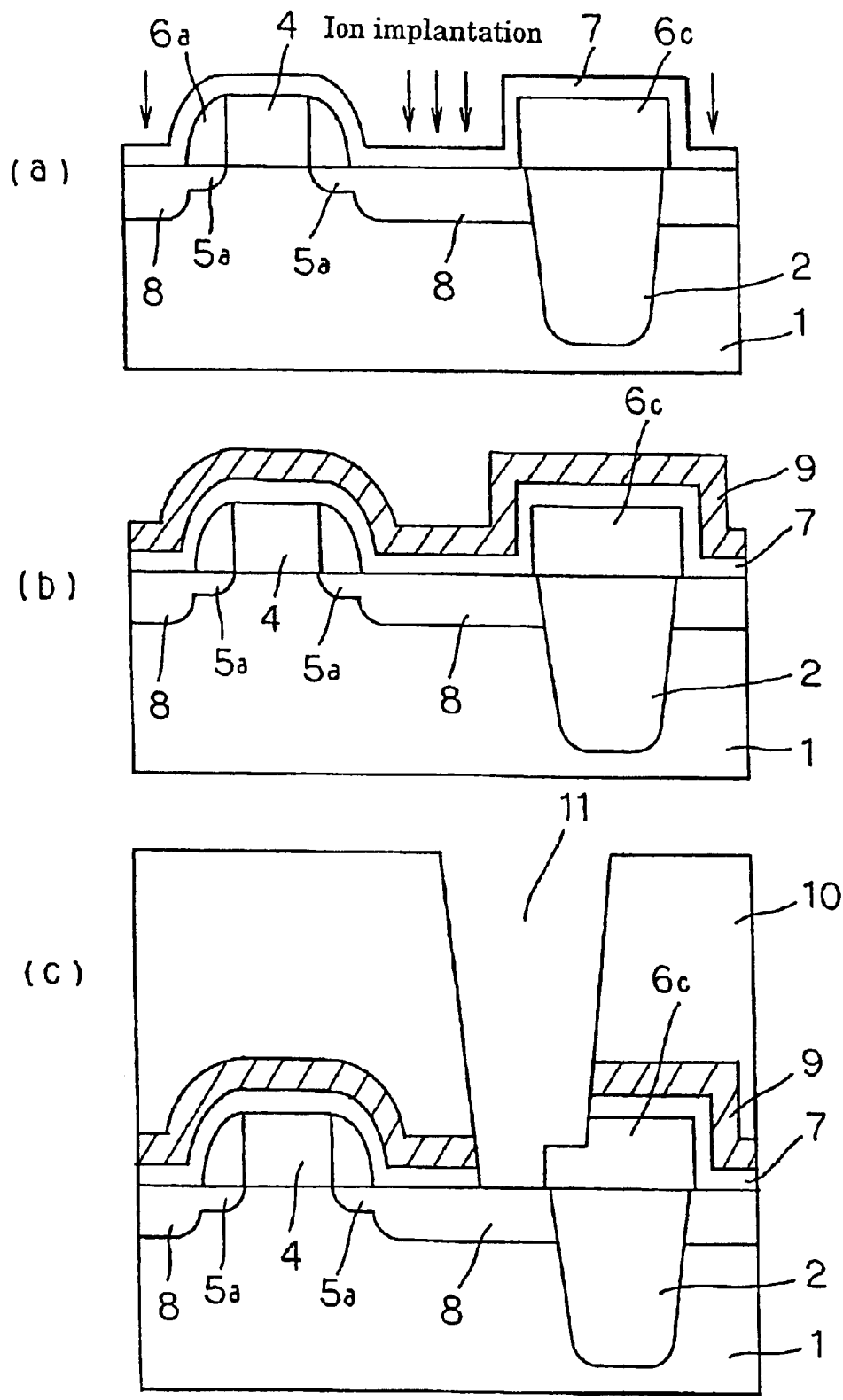
FIG. 10 is a series of schematic cross-sectional views illustrating further steps of the fourth embodiment of a manufacturing method of a semiconductor device according to the present invention.
Figure 11:
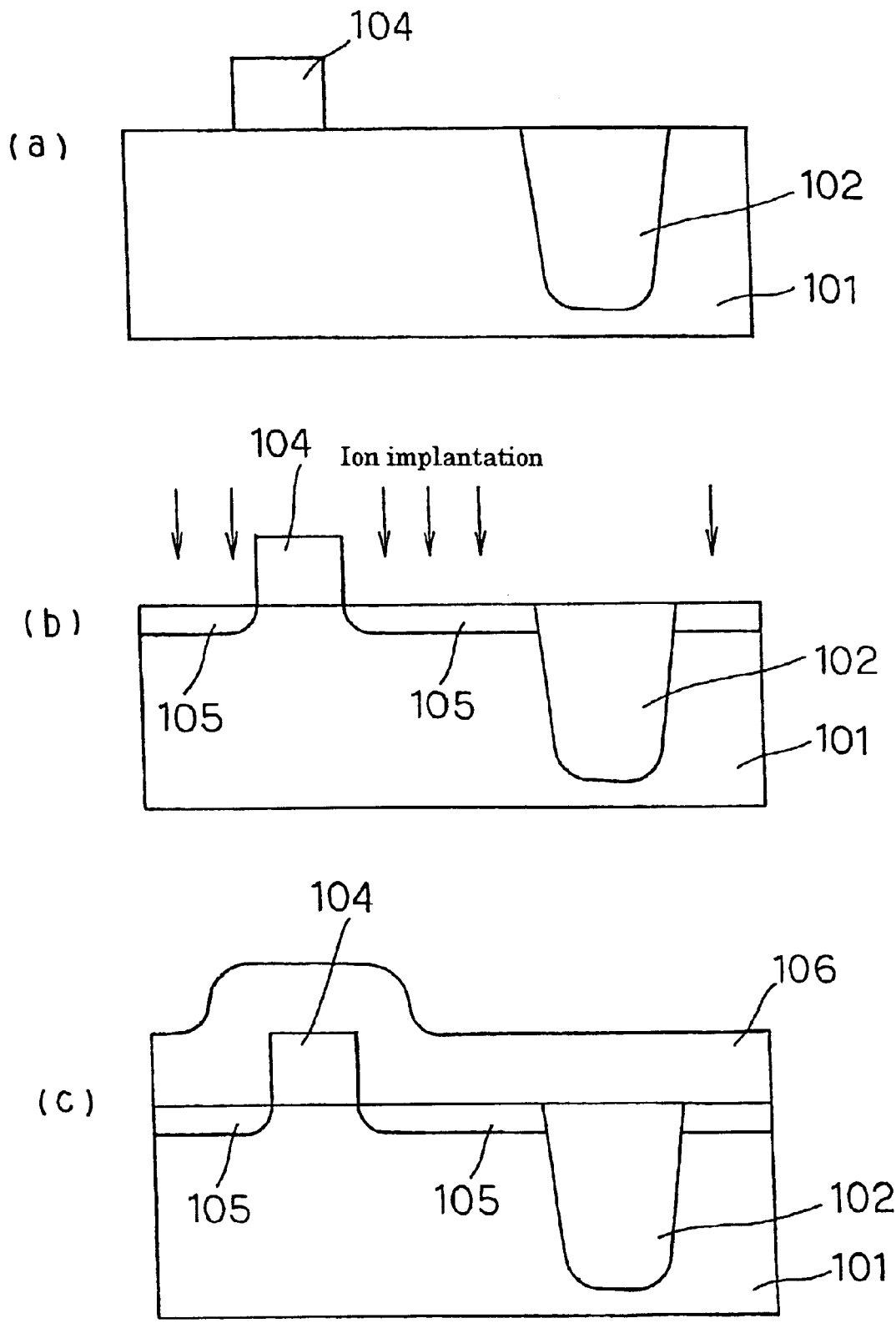
FIG. 11 is a series of schematic cross-sectional views illustrating the steps of a conventional manufacturing method of a semiconductor device.
Figure 12:
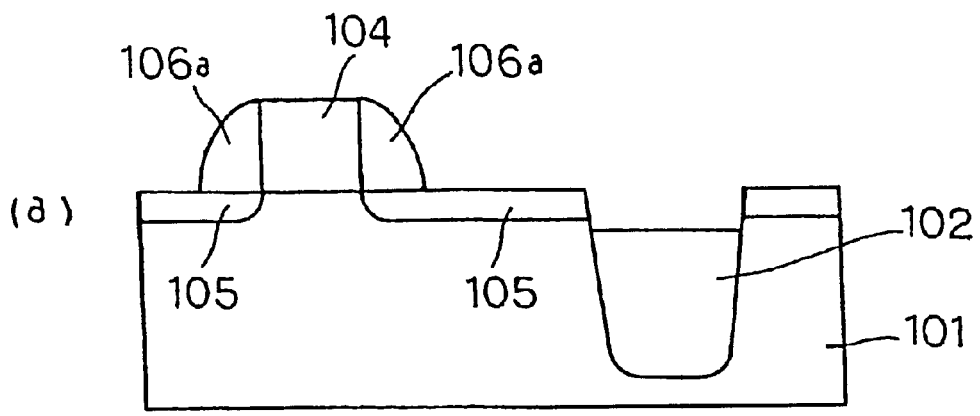
FIG. 12 is a series of schematic cross-sectional views illustrating further steps of a conventional manufacturing method of a semiconductor device.
Figure 12:
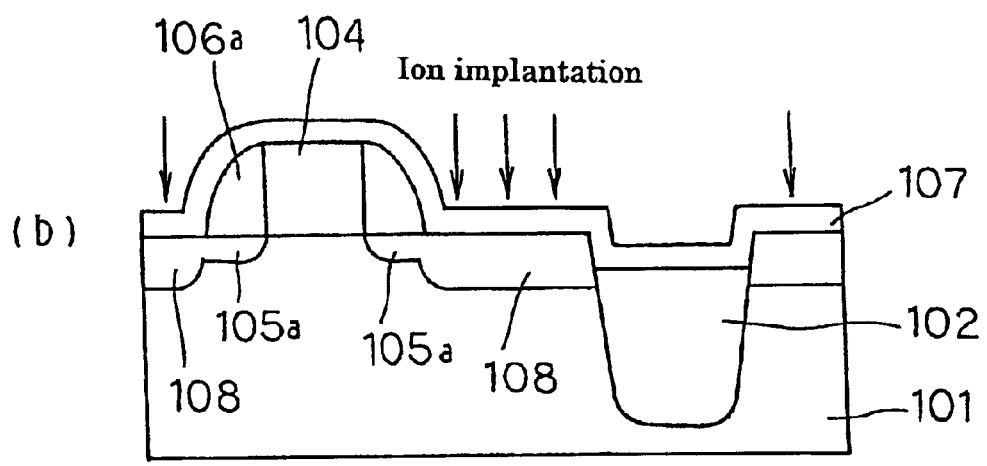
Figure 12:
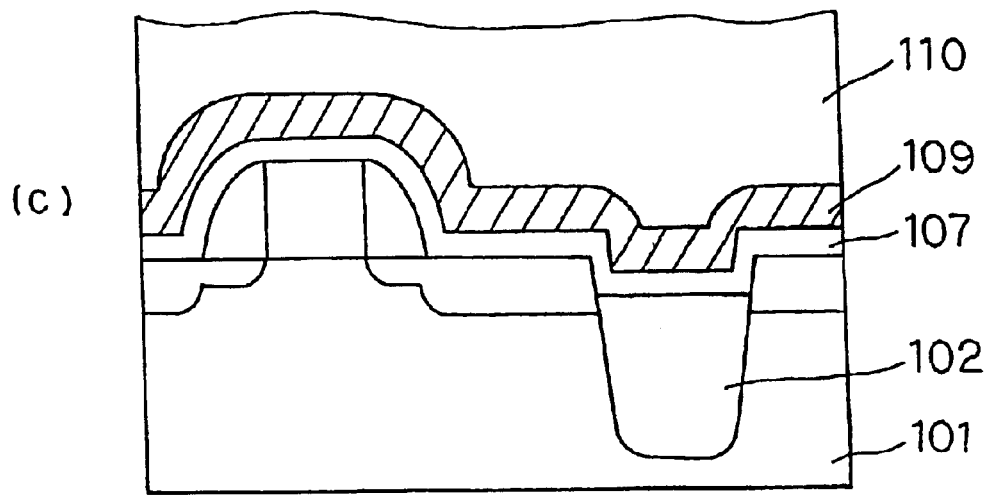
Figure 13:
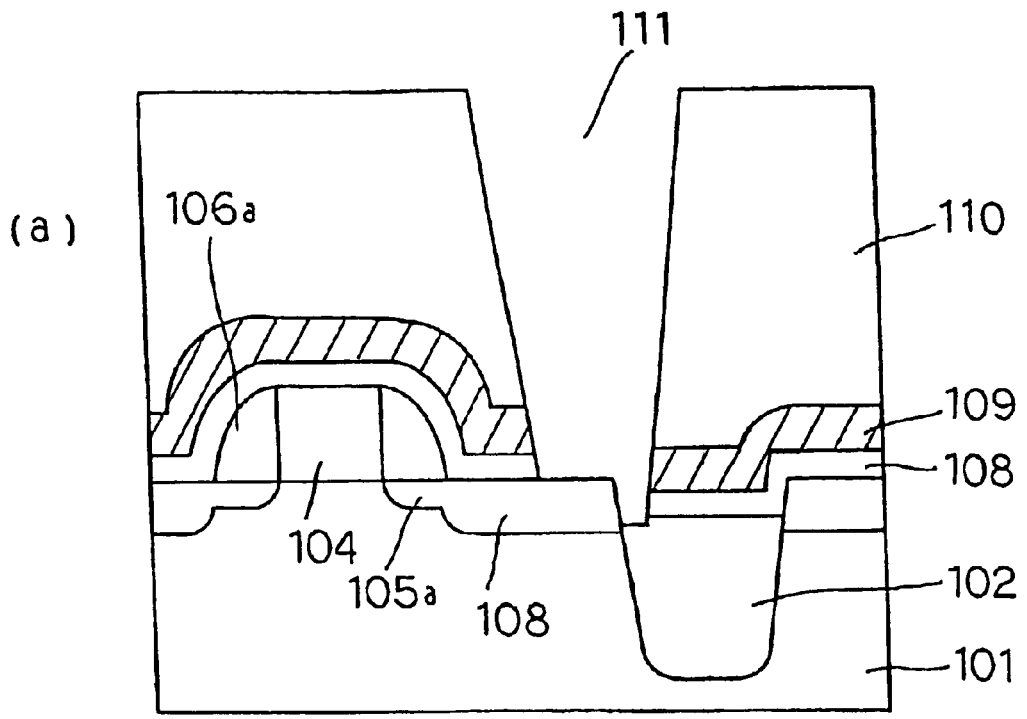
FIG. 13 is a pair of schematic cross-sectional views each showing the state after a contact hole is formed by a conventional manufacturing method of a semiconductor device.
Figure 13:
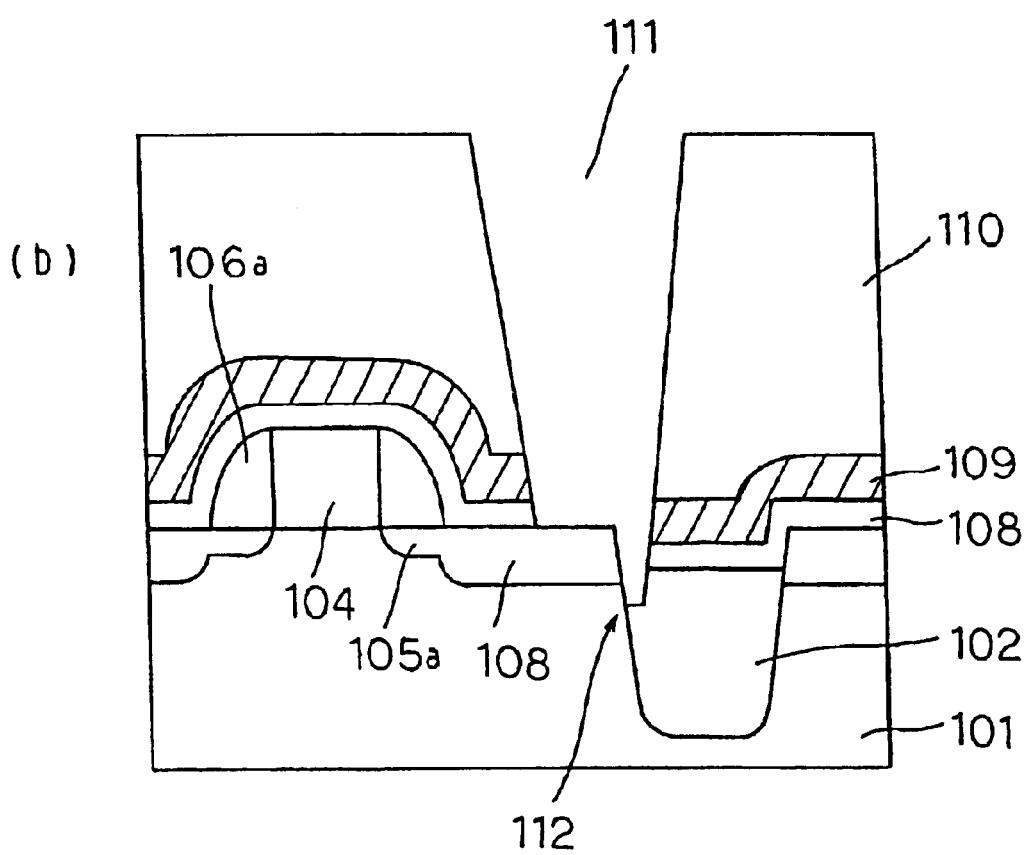

FIGS. 9 and 10 are a series of schematic cross-sectional views illustrating the steps of the fourth embodiment of a manufacturing method according to the present invention. It is pointed that FIG. 9(a) is same as FIG. 6(c). A structure shown in FIG. 9(a) is formed in the same steps as shown from FIG. 6(a) to FIG. 6(c) of the third embodiment.

FIG. 9(b) shows that a resist film 51 is formed on the silicon oxide film 6 to cover the region above the trench isolation region 2 (FIG. 9(b)). The pattern of a resist film 51 is same as the pattern of trench isolation region. Thus, in the patterning of the resist film 51, the same mask can be used as in the trench isolation region patterning.

Next, the silicon oxide film 6 is etched back by anisotropic etching and thereby sidewalls 6a of silicon oxide are formed on the lateral faces of the gate electrode 4 (FIG. 9(c)). It is noted that the silicon oxide film 6c above the trench isolation region is not etched because of the resist film 51, which prevent from the drop of the top surface level of the buried oxide film inside the trench isolation region 2.

After the removal of the resist film 51, a channeling stop film 7 of a silicon oxide film is formed with a thickness from 5 nm to 30 nm to prevent channeling in the subsequent step an ion implantation for the formation of source/drain regions (FIG. 10 (a)). Following that, in the same condition as the first embodiment, an ion implantation is applied through this channeling stop film 7, and thereby source/drain regions 8 with a high concentration of dopant are formed. Then a heat treatment is carried out to activate the source/drain regions 8. It is possible to form silicide films on both the source/drain regions 8 and the gate electrode 4 in the same way as the first embodiment.

It is noted that the removal of the silicon oxide film 7 is possible if another preventive measure against channeling can be taken. In this case, the step of the ion implantation for the formation of the source/drain regions is performed just after the etch back of the silicon oxide film 6, and the removal of the resist film 51 and a heat treatment for activation of source/drain regions is performed later.

Next, an etching stopper film 9 of a silicon nitride film is formed with a thickness from 10 nm to 100 nm or so over the entire surface of the substrate (FIG. 10(*b*)).

After that, an interlayer insulating film 10 of a silicon oxide film or such is formed, and a contact hole 11 is opened, in the same way as the first embodiment, on the source/drain region 8 by lithography and anisotropic etching (FIG. 10(*c*)). It is noted that the etching for contact holes is stopped once on the silicon nitride film 9 over the top surface of trench isolation region 2 when a contact hole is formed overlapping the trench isolation region 2. Because of the existence of a sufficiently thick silicon oxide film which has being formed over the surface of the trench isolation region in the sidewall formation, the bottom of the contact hole is prevented to reach lower than the junction depth of the source/drain region inside the trench isolation region, and the leakage between the contact and the substrate is prevented.

Following that, using the CVD method or the sputtering method, a barrier metal film is formed inside the contact hole 11, and the contact hole is filled with a metal film of W or such, whereby a contact is formed (not shown in the drawing).

What is claimed is:

1. A method of manufacturing a semiconductor device which has an isolation region with a trench isolation structure, comprising a trench formed on a semiconductor substrate and a buried insulating film buried within said trench; which comprises the steps of:
    forming a gate electrode in an active region adjacent to said isolation region on said semiconductor substrate;
    applying an ion implantation onto said semiconductor substrate using said gate electrode as a mask to form a first dopant diffusion region which is to be used as a LDD region;
    forming a first insulating film and a second insulating film, in this order, on the entire surface of a principal plane of said semiconductor substrate, inclusive of said gate electrode;
    performing an etch back, using said first insulating film as an etching stopper, to form a first sidewall from said second insulating film on a lateral face of said gate electrode, with said first insulating film lying therebetween;
    forming a resist film, being patterned so as to cover said isolation region;
    etching said first insulating film by an entire surface etch back, with said resist film being used as a mask, whereby forming a second sidewall from said first insulating film on the lateral face of said gate electrode as well as a trench isolation cover from said first insulating film to cover said isolation region;
    making another ion implantation, using said gate electrode as well as said first and said second sidewall as a mask, to form a second dopant diffusion region which is to be used as a source/drain region;
    forming an interlayer insulating film on the entire surface of the principal plane of said semiconductor substrate; and etching said interlayer insulating film selectively under the condition that said trench isolation cover functions as an etching stopper, and thereby forming a contact hole to reach said second dopant diffusion region from the top surface of said interlayer insulating film.

2. A method of manufacturing a semiconductor device according to claim 1, wherein said second insulating film is formed of a material having a substantially identical etching rate with the one of said buried insulating film.

3. A method of manufacturing a semiconductor device according to claim 1, wherein said second insulating film and said buried insulating are each made of a silicon oxide film, while said first insulating film is made of a silicon nitride film.

4. A method of manufacturing a semiconductor device according to claim 1, which further comprises the step of forming an underlying insulating film on the entire surface of the principal plane of said semiconductor substrate, inclusive of second gate electrode, wherein said first insulating film is formed after said underlying insulating film is formed.

5. A method of manufacturing a semiconductor device according to claim 4, wherein, in performing the entire surface etch back to form said second sidewall, said underlying insulating film is etched together with said first insulating film, and the top surface of said gate electrode and the top surface of the substrate are exposed, whereby a third sidewall is formed from said underlying insulating film on the lateral face of said gate electrode.

6. A method of manufacturing a semiconductor device according to claim 5, wherein, in the formation of said second dopant diffusion region, after a channeling stop film is formed, at least, in said active region, a second dopant diffusion region is formed by applying the ion implantation through said channeling stop film thereto with said gate electrode as well as said first, said second and said third sidewall being used as a mask.

7. A method of manufacturing a semiconductor device according to claim 4, wherein, in performing the entire surface etch back to form said second sidewall, said first insulating film is etched in such a way what said underlying insulating film may remain; and
    a second dopant diffusion region which is to be used as a source/drain region is formed by applying the ion implantation thereto through said underlying insulating film.

8. A method of manufacturing a semiconductor device according to claim 4, wherein the ion implantation to form said first dopant diffusion region is carried out after said underlying insulating film is formed but before said second insulating film is formed.

9. A method of manufacturing a semiconductor device according to claim 1, wherein the ion implantation to form said first dopant diffusion region is carried out after said first insulating film is formed but before said second insulating film is formed.

10. A method of manufacturing a semiconductor device according to claim 1, wherein said contact hole is formed, extending partly into said second dopant diffusion region and said isolation region.

11. A method of manufacturing a semiconductor device according to claim 1, wherein said interlayer insulating film is formed of a material having a substantially identical etching rate with the one of said buried insulating film.

12. A method of manufacturing a semiconductor device which has an isolation region with a trench isolation structure, comprising a trench formed on a semiconductor substrate and a buried insulating film buried within said trench; which comprises the steps of:
    forming a gate electrode in an active region adjacent to said isolation region on said semiconductor substrate;
    applying an ion implantation onto said semiconductor substrate using said gate electrode as a mask to form a first dopant diffusion region which is to be used as a LDD region;

forming a first insulating film and a second insulating film, in this order, on the entire surface of a principal plane of said semiconductor substrate, inclusive of said gate electrode;

performing an etch back, using said first insulating film as an etching stopper, to form a first sidewall from said second insulating film on a lateral face of said gate electrode, with said first insulating film lying therebetween;

etching said first insulating film by an entire surface etch back to form a second sidewall from said first insulating film on the lateral face of said gate electrode;

making another ion implantation, using said gate electrode as well as well as said first and said second sidewall as a mask, to form a second dopant diffusion region which is to be used as a source/drain region;

forming an interlayer insulating film on the entire surface of the principal plane of said semiconductor substrate;

forming a contact hole opened on said second dopant diffusion region from the top surface of said interlayer insulating film; and forming an underlying insulating film on the entire surface of the principal plane of said semiconductor substrate, inclusive of said gate electrode, wherein said first insulating film is formed after said underlying insulating film is formed, wherein, in performing the entire surface etch back to form said second sidewall, said first insulating film is etched in such a way that said underlying insulating film may remain; and a second dopant diffusion region which is to be used as a source/drain region is formed by applying the ion implantation thereto through said underlying insulating film, wherein a channeling stop film is formed on said underlying insulating film, and the second dopant diffusion region which is to be used as a source/drain region is formed by applying the ion implantation thereto through said underlying insulating film and said channeling stop film.

13. The method of manufacturing a semiconductor device according to claim 12, further comprising the steps of:

forming a third insulating film on the entire surface of the principal plane of said semiconductor substrate before forming the interlayer insulating film, and etching said interlayer insulating film selectively, with said third insulating film being used as an etching stopper, to expose said third insulating film, and, then, etching said third insulating film selectively, and thereby forming a contact hole to reach said second dopant diffusion region from the top surface of said interlayer insulating film.

14. The method of manufacturing a semiconductor device according to claim 12, wherein said contact hole extends partly into said second dopant diffusion region and said isolation region.

15. A method of manufacturing a semiconductor device according to claim 12, wherein the ion implantation to form said first dopant diffusion region is carried out after said underlying insulating film is formed but before said second insulating film is formed.

16. A method of manufacturing a semiconductor device according to claim 12, wherein the ion implantation to form said first dopant diffusion region is carried out after said first insulating film is formed but before said second insulating film is formed.

17. A method of manufacturing a semiconductor device according to claim 12, wherein said interlayer insulating film is formed of a material having a substantially identical etching rate with the one of said buried insulating film.

18. A method of manufacturing a semiconductor device which has an isolation region with a trench isolation structure, comprising a trench formed on a semiconductor substrate and a buried insulating film buried within said trench; which comprises the steps of:

forming a gate electrode in an active region adjacent to said isolation region on said semiconductor substrate;

applying an ion implantation onto said semiconductor substrate using said gate electrode as a mask to form a first dopant diffusion region which is to be used as a LDD region;

forming a first insulating film on said semiconductor substrate;

performing an entire surface etch back to form a sidewall from said first insulating film on a lateral face of said gate electrode;

making another ion implantation, using said gate electrode and said sidewall as a mask, to form a second dopant diffusion region which is to be used as a source/drain region;

forming a second insulating film on the entire surface of a principal plane of said semiconductor substrate;

forming a resist film being patterned so as to cover said isolation region;

etching said second insulating film, with said resist film being used as a mask, whereby forming a trench isolation cover from said second insulating film to cover said isolation region;

forming an interlayer insulating film on the entire surface of the principal plane of said semiconductor substrate; and etching said interlayer insulating film selectively under the condition that said trench isolation cover functions as an etching stopper, and thereby forming a contact hole to reach said second dopant diffusion region from the top surface of said interlayer insulating film.

19. A method of manufacturing a semiconductor device according to claim 18, wherein said first insulating film is formed of a material having a substantially identical etching rate with the one of said buried insulating film.

20. A method of manufacturing a semiconductor device according to claim 18, wherein said first insulating film and said buried insulating are each made of a silicon oxide film, while said second insulating film is made of a silicon nitride film.

21. A method of manufacturing a semiconductor device according to claim 18, which further comprises the step of forming a channeling stop film, at least, in said active region, wherein the ion implantation is applied thereto through said channeling stop film to form said second dopant diffusion region.

22. A method of manufacturing a semiconductor device according to claim 18, wherein said contact hole is formed, extending partly into said second dopant diffusion region and said isolation region.

23. A method of manufacturing a semiconductor device according to claim 18, wherein said interlayer insulating film is formed of a material having a substantially identical etching rate with the one of said buried insulating film.

* * * * *